United States Patent
Choi et al.

(10) Patent No.: US 12,171,119 B2
(45) Date of Patent: Dec. 17, 2024

(54) LIGHT EMITTING DISPLAY APPARATUS

(71) Applicant: LG Display Co., Ltd., Seoul (KR)

(72) Inventors: Mingeun Choi, Paju-si (KR); Sookang Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 310 days.

(21) Appl. No.: 17/409,137

(22) Filed: Aug. 23, 2021

(65) Prior Publication Data
US 2022/0069038 A1    Mar. 3, 2022

(30) Foreign Application Priority Data

Sep. 1, 2020 (KR) .......................... 10-2020-0111215

(51) Int. Cl.
| | |
|---|---|
| H10K 50/822 | (2023.01) |
| H10K 50/856 | (2023.01) |
| H10K 59/122 | (2023.01) |
| H10K 59/124 | (2023.01) |
| H10K 59/126 | (2023.01) |
| H10K 59/80 | (2023.01) |

(52) U.S. Cl.
CPC ......... *H10K 59/122* (2023.02); *H10K 50/856* (2023.02); *H10K 59/124* (2023.02); *H10K 59/126* (2023.02)

(58) Field of Classification Search
CPC ......... H01L 2251/5392; H01L 51/5275; H01L 27/3246; H01L 27/3283; H01L 27/3295
See application file for complete search history.

(56) References Cited

U.S. PATENT DOCUMENTS

| | | | |
|---|---|---|---|
| 8,569,774 B2 | 10/2013 | Yuasa | |
| 10,879,486 B2 | 12/2020 | Park et al. | |
| 2014/0353643 A1* | 12/2014 | Seo | H10K 71/60 438/23 |
| 2015/0076547 A1* | 3/2015 | Totani | H01L 33/145 257/98 |
| 2016/0248035 A1* | 8/2016 | Hwang | H10K 59/122 |
| 2017/0125489 A1* | 5/2017 | Jang | H10K 50/858 |
| 2017/0125738 A1* | 5/2017 | Kim | H10K 50/822 |
| 2019/0006557 A1* | 1/2019 | Kim | H01L 33/20 |

FOREIGN PATENT DOCUMENTS

| | | |
|---|---|---|
| KR | 10-2013-0044120 A | 5/2013 |
| KR | 10-2014-0141459 A | 12/2014 |
| KR | 10-2017-0052467 A | 5/2017 |
| KR | 10-2020-0005348 A | 1/2020 |

OTHER PUBLICATIONS

Office Action dated Oct. 25, 2024 issued in corresponding Korean Patent Application No. 10-2020-0111215.

* cited by examiner

*Primary Examiner* — Vu A Vu
*Assistant Examiner* — Valerie N Newton
(74) *Attorney, Agent, or Firm* — Morgan, Lewis & Bockius LLP

(57) ABSTRACT

The light emitting display apparatus may include a pixel area disposed at a substrate and configured to have an emission area and a non-emission area, a planarization layer disposed at the substrate, and a light emitting device layer disposed at the emission area and the non-emission area above the planarization layer. The light emitting device layer may include a barrier layer disposed at the boundary area between the emission area and the non-emission area. The light emitting display apparatus may be capable of preventing a leakage current between adjacent pixels.

20 Claims, 8 Drawing Sheets

LIGHT EMITTING DISPLAY APPARATUS

CROSS-REFERENCE TO RELATED APPLICATIONS

This application claims the benefit of the Korean Patent Application No. 10-2020-0111215 filed on Sep. 1, 2020, which are hereby incorporated by reference as if fully set forth herein.

BACKGROUND

Technical Field

The present disclosure relates to a light emitting display apparatus.

Discussion of the Related Art

A light emitting display apparatus is a self-emitting display apparatus. Unlike a liquid crystal display apparatus, the light emitting display apparatus may be fabricated at a lightweight and slim size as it does not need an additional light source.

The light emitting display apparatus displays an image by a light emission of a light emitting portion interposed between two electrodes.

In the light emitting display apparatus, the light emitting portion of a pixel may be formed in a tandem structure in which two or more light emitting layers are stacked. In the light emitting portion having the tandem structure, the light emitting layers are provided as a common layer in the plurality of pixels, whereby a current may leak from any one pixel from another adjacent pixel among the plurality of pixels. Thus, a color realization ratio may be deteriorated due to a lateral leakage current between the adjacent pixels, and the lateral leakage current may be clearly visible in a low grayscale area. For example, when a driving voltage of a blue pixel is relatively lower than a driving voltage of a red pixel, the adjacent red pixel having a turn-off state may emit light due to the lateral leakage current flowing from the blue pixel to a lateral (or horizontal) direction. Accordingly, a grayscale expression of a blue color may be difficult, a color realization ratio and a picture quality related with a low grayscale image may be deteriorated due to a color mixture of the adjacent pixels, and a resolution may be deteriorated.

SUMMARY

Accordingly, embodiments of the present disclosure are directed to a light emitting display apparatus that substantially obviates one or more of the problems due to limitations and disadvantages of the related art.

An aspect of the present disclosure to provide a light emitting display apparatus capable of preventing a leakage current between adjacent pixels.

An aspect of the present disclosure is to provide a light emitting display apparatus that improves an aperture ratio in pixels, and prevents a picture quality from being deteriorated by a leakage current between the adjacent pixels.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a light emitting display apparatus comprises a substrate, a pixel area disposed at the substrate and configured to have an emission area and a non-emission area, a planarization layer disposed at the substrate, and a light emitting device layer disposed at the emission area and the non-emission area above the planarization layer, wherein the light emitting device layer includes a barrier layer disposed at the boundary area between the emission area and the non-emission area.

In another aspect, a light emitting display apparatus comprises a substrate, a pixel area disposed at the substrate and configured to have an emission area and a non-emission area, a planarization layer disposed at the substrate, and a light emitting device layer disposed at the pixel area above the planarization layer, wherein the light emitting device layer includes a first electrode, a self-light emitting portion on the first electrode, and a second electrode on the self-light emitting portion, wherein a barrier layer is disposed at the periphery of the shortest distance between the first electrode and the second electrode.

The light emitting display apparatus according to the present disclosure may prevent a leakage current between the adjacent pixels, and may prevent a color mixture between the adjacent pixels.

The light emitting display apparatus according to the present disclosure may improve an aperture ratio of the pixel, and may prevent a picture quality from being deteriorated by the leakage current between the adjacent pixels.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION

Figure 1:
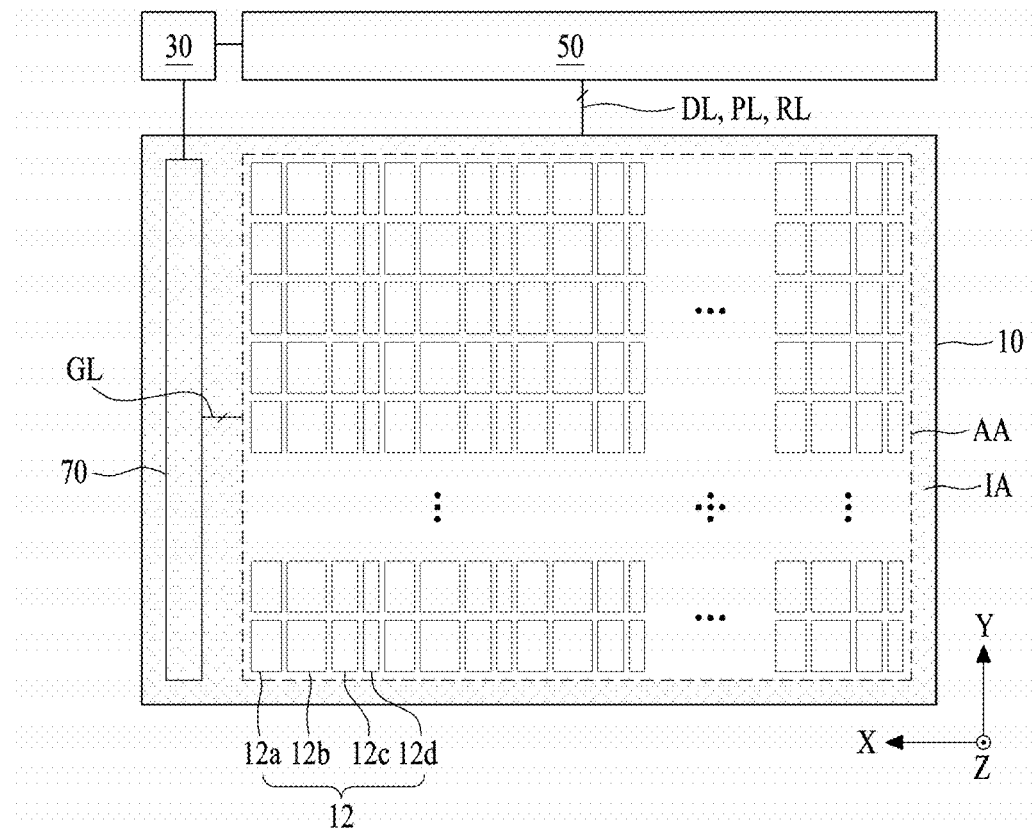
FIG. 1 illustrates a light emitting display apparatus according to an embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by the scopes of the appended claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted. In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a positional relationship, for example, when a position relation between two parts is described as 'on-', 'over-', 'under-', and 'next-', one or more other parts can be disposed between the two parts unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first," "second," and the like can be used herein to describe various elements, these elements should not be limited by these terms. These terms are only used to distinguish one element from another and may not define any order. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, embodiments of the present disclosure will be described in detail with reference to the accompanying drawings. For convenience of description, a scale of each of elements illustrated in the accompanying drawings differs from a real scale, and thus, is not limited to a scale illustrated in the drawings.

FIG. 1 illustrates a light emitting display apparatus according to an embodiment of the present disclosure.

Referring to FIG. 1, the light emitting display apparatus according to an embodiment of the present disclosure may include a display panel 10, a control circuit 30, a data driving circuit 50, and a gate driving circuit 70.

The display panel 10 may include a display area AA (or active area) defined on a substrate, and a non-display area IA (or non-active area) configured to surround the display area AA.

The display area AA is an area for displaying an image. The display area AA may be a pixel array area, an active area, a display area, or a screen. For example, the display area AA may be disposed at a central area of the display panel 10.

The non-display area IA is an area in which an image is not displayed. The non-display area IA may be a peripheral circuit area, a signal supply area, a non-active area, or a bezel area. The non-display area IA may be configured to surround the display area AA.

The display area AA according to an embodiment of the present disclosure may include pixels 12a, 12b, 12c and 12d arranged in pixel areas defined by 'n' gate lines GL and 'm' data lines DL.

Each of the 'n' gate lines GL extends along a first direction X, and the 'n' gate lines GL may be provided at fixed intervals along a second direction Y perpendicular to the first direction X. For example, each of the 'n' gate lines GL may include a first gate line and a second gate line.

Each of the 'm' data lines DL extends along the second direction Y, and the 'm' data lines DL may be provided at fixed intervals along the first direction X.

The display area AA may further include a plurality of pixel driving voltage lines PL and a plurality of reference voltage lines RL arranged in parallel with the data line DL. Each of the 'n' gate lines GL may include an intersection portion which intersects with the 'm' data lines DL, the plurality of pixel driving voltage lines PL, and the plurality of reference voltage lines RL. The intersection portion of each of the 'n' gate lines GL may include at least one slit or opening configured to minimize an overlap area with other lines.

Each of the plurality of pixels 12a, 12b, 12c and 12d may be defined as a minimum unit area in which light is virtually emitted, for example, a sub-pixel.

According to an embodiment of the present disclosure, among the plurality of pixels 12a, 12b, 12c and 12d, the three pixels which are disposed adjacently or disposed along a length direction of the gate line (or data line) configure a unit pixel 12. A unit pixel 12 may include a red pixel, a green pixel, and a blue pixel, but embodiments of the present disclosure are not limited thereto. For example, a unit pixel 12 may include at least one red pixel, at least one green pixel, and at least one blue pixel, but embodiments of the present disclosure are not limited thereto.

According to another embodiment of the present disclosure, among the plurality of pixels 12a, 12b, 12c and 12d, the four pixels which are disposed adjacently or disposed along a length direction of the gate line (or data line) constitute a unit pixel 12. A unit pixel 12 may include a red pixel, a green pixel, a blue pixel, and a white pixel, but embodiments of the present disclosure are not limited thereto. For example, a unit pixel 12 may include at least one red pixel, at least one green pixel, at least one blue pixel, and at least one white pixel, but embodiments of the present disclosure are not limited thereto.

The plurality of pixels 12a, 12b, 12c and 12d configuring the one unit pixel 12 may have the same size or different sizes from each other. For example, when the one unit pixel 12 comprises the red pixel, the green pixel, the blue pixel, and the white pixel, the white pixel 12b has the largest size, the blue pixel 12d has the smallest size, the red pixel 12a may be relatively smaller than the white pixel 12a, and the green pixel 12c may be relatively smaller than the red pixel 12a.

Each of the plurality of pixels 12a, 12b, 12c and 12d may include a pixel circuit, and a light emitting device layer coupled to the pixel circuit. The light emitting device layer may include a first electrode, a second electrode, and a light emitting portion interposed between the first electrode and the second electrode.

The light emitting portion disposed in each of the plurality of pixels 12a, 12b, 12c and 12d may emit individually different colored light or may emit white colored light in common. According to an embodiment of the present disclosure, when the light emitting device layer of each of the plurality of pixels 12a, 12b, 12c and 12d emit white colored light in common, each of the red pixel, the green pixel, and the blue pixel may include a different color filter (or wavelength conversion member) which converts white colored light into different colored light. For example, the white pixel according to an embodiment of the present disclosure may not include a color filter. At least a portion of the white pixel according to another embodiment of the present disclosure may include the same color filter as any one of the red pixel, the green pixel, and the blue pixel.

The light emitting portion disposed in each of the plurality of pixels 12a, 12b, 12c and 12d may emit light to the substrate in accordance with a bottom emission type. For example, each of the plurality of pixels 12a, 12b, 12c and 12d may be configured without a separate bank pattern (or bank, or pixel definition film) for defining the pixel area at the substrate. The light emitting portion disposed in each of the plurality of pixels 12a, 12b, 12c and 12d may include a barrier layer configured to prevent or block a lateral leakage current between the adjacent pixels 12a, 12b, 12c and 12d. For example, the barrier layer may be a current barrier layer, a current blocking layer, or an electrical disconnection layer.

The barrier layer according to an embodiment of the present disclosure may be implemented at a periphery area of the shortest distance between the first electrode and the second electrode. The barrier layer according to another embodiment of the present disclosure may be implemented between the first electrode and the second electrode confronting each other with the light emitting portion having the smallest thickness therebetween. For example, the barrier layer may pass through the light emitting portion to be physically connected or coupled between the first electrode and the second electrode. Accordingly, the light emitting portion disposed in each of the plurality of pixels 12a, 12b, 12c and 12d may be electrically disconnected by the barrier layer. A detailed description for the barrier layer will be described below.

The control circuit 30 may generate a data signal for each pixel corresponding to each of the plurality of pixels 12a, 12b, 12c and 12d based on an image signal. The control circuit 30 according to an embodiment of the present disclosure extracts white pixel data based on the image signal, that is, red input data, green input data, and blue input data in each unit pixel 12, calculates red pixel data, green pixel data, and blue pixel data by reflecting offset data based on the extracted white pixel data on the red input data, the green input data, and the blue input data, aligns the calculated red pixel data, the calculated green pixel data, the calculated blue pixel data, and the calculated white pixel data in accordance with a pixel arrangement structure, and may supply the aligned data to the data driving circuit 50. For example, the control circuit 30 may converts the red input data, the green input data, and the blue input data into four colored data of red, green, blue, and white in accordance with a data conversion method disclosed in the Korean Patent Application No. 10-2013-0060476 or No. 10-2013-0030598.

The control circuit 30 may drive the gate driving circuit 50 and the data driving circuit 70 in accordance with a display mode or a sensing mode. The control circuit 30 generates a data control signal and a gate control signal configured to drive each of the gate driving circuit 50 and the data driving circuit 70 in the display mode or the sensing mode based on timing synchronized signal, provides the data control signal to the data driving circuit 50, and may provide the gate control signal to the gate driving circuit 70. For example, the sensing mode (or external compensation driving) may be carried out for a blank period of a frame set in real time or periodically when the light emitting display apparatus is in a test process before a product shipping, the display panel 10 is driven for the first time, the light emitting display apparatus is in a power-on state or a power-off state, or the display panel 10 is in a power-off state after a long-time operation.

The control circuit 30 stores sensing data for each pixel, provided from the data driving circuit 50 in accordance with the sensing mode, in a storage circuit. And, the control circuit 30 corrects pixel data to be supplied to each pixel 12a, 12b, 12c and 12d based on the sensing data stored in the storage circuit, and may provide the corrected data to the data driving circuit 50. Herein, the sensing data for each pixel may include information about changes according to time in each of a driving transistor and an emission device. Accordingly, in the sensing mode, the control circuit 350 senses a characteristic value (for example, threshold voltage or mobility) of the driving transistor disposed in each pixel 12a, 12b, 12c and 12d, and corrects the pixel data to be supplied to each pixel 12a, 12b, 12c and 12d based on the characteristic value, to thereby minimize or prevent a deterioration of a picture quality in accordance with a deviation of the characteristic value of the driving transistor in the plurality of pixels. An applicant of the present disclosure has already announced the sensing mode of the light emitting display apparatus. Thus, a detailed description for the sensing mode of the light emitting display apparatus will be omitted. For example, the light emitting display apparatus according to the embodiment of the present disclosure may sense the characteristic value (for example, threshold voltage or mobility) of the driving transistor disposed in each pixel 12a, 12b, 12c and 12d in accordance with the sensing mode disclosed in the Korean Patent Application No. 10-2016-0093179, No. 10-2017-0054654 or No. 10-2018-0002099.

The data driving circuit 50 may be individually coupled (or connected) to each of the 'm' data lines DL implemented at the display panel 10. The data driving circuit 50 receives the data signal for each pixel and the data control signal provided from the control circuit 30, and may receive a plurality of reference gamma voltages provided from a power source circuit.

In the display mode, the data driving circuit 50 converts a data signal for each pixel in a digital type into a data voltage for each pixel in an analog type by the use of the data control signal and the plurality of reference gamma voltages, supplies the converted data voltage for each pixel to the corresponding data line DL, generates a reference voltage synchronized with the data voltage, and may supply the generated reference voltage to a plurality of reference voltage lines RL.

In the sensing mode, the data driving circuit 50 converts a sensing data signal in a digital type into a sensing data voltage in an analog type by the use of the data control signal and the plurality of reference gamma voltages, supplies the sensing data voltage to the corresponding pixel 12a, 12b, 12c and 12d through the data line DL, senses the characteristic value of the driving transistor disposed in the corresponding pixel 12a, 12b, 12c and 12d through each of the plurality of reference voltage lines RL, and may provide the sensing data for each pixel to the control circuit 30. For example, the data driving circuit 50 may sequentially sense the first to fourth pixels 12a, 12b, 12c and 12d configuring the unit pixel 12.

The gate driving circuit 70 may be individually coupled (or connected) to each of the 'n' gate lines GL prepared in a pixel array portion 10. The gate driving circuit 70 generates a gate signal in accordance with a predetermined order based on the gate control signal supplied from the control circuit 30, and may supply the gate signal to the corresponding gate line GL.

The gate driving circuit 70 according to an embodiment of the present disclosure may be disposed at the non-display area IA of the substrate in accordance with a manufacturing process of a thin film transistor. For example, the gate driving circuit 70 may be integrated in one lateral side and/or both lateral sides of the substrate according to a manufacturing process of a thin film transistor, and may be coupled (or connected) to the plurality of gate lines GL in one-to-one correspondence.

The gate driving circuit 70 according to another embodiment of the present disclosure may be embodied in an integrated circuit, mounted on the substrate or a flexible circuit film, and may be coupled (or connected) to the plurality of gate lines GL in one-to-one correspondence.

Meanwhile, when the data driving circuit 50 is driven only in the display mode without the sensing mode, the plurality of reference voltage lines RL disposed at the display area AA may be omitted, and the data driving circuit 50 may supply only the data voltage to the corresponding data line DL.

Figure 2:
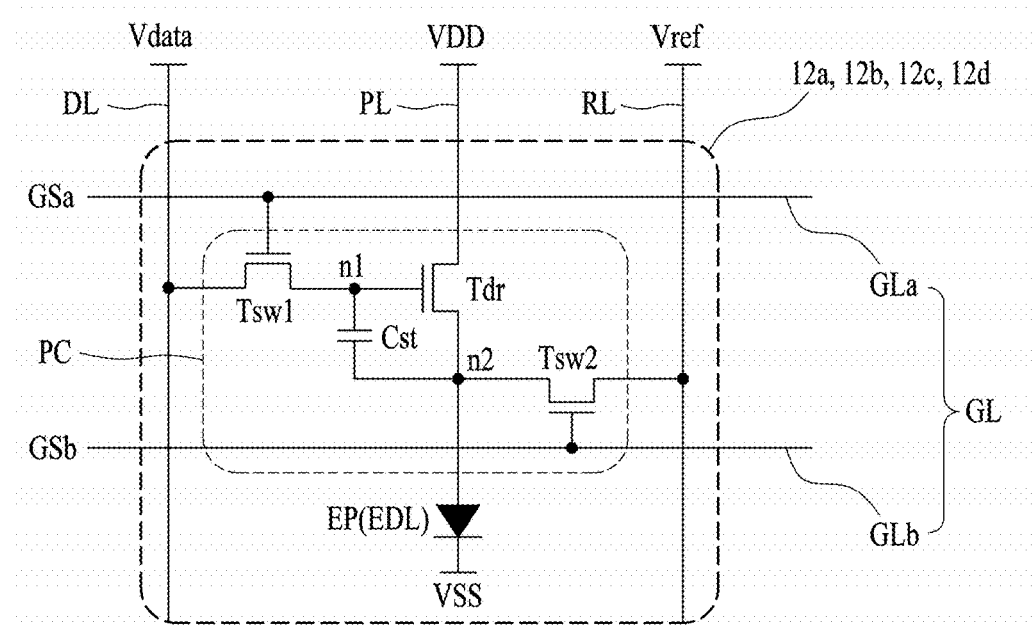
FIG. 2 is an equivalent circuit diagram of one pixel shown in FIG. 1.

FIG. 2 is an equivalent circuit diagram of one pixel shown in FIG. 1.

Referring to FIG. 2, the pixel 12a, 12b, 12c and 12d according to an embodiment of the present disclosure includes a pixel circuit PC and a light emitting device layer EDL.

The pixel circuit PC may include a first switching thin film transistor Tsw1, a second switching thin film transistor Tsw2, a driving thin film transistor Tdr, and a capacitor Cst. The thin film transistors Tsw1, Tsw2 and Tdr may be N-type thin film transistors.

As an embodiment, at least one or more among the first switching thin film transistor Tsw1, the second switching thin film transistor Tsw2, and the driving thin film transistor Tdr may include a semiconductor layer (or activation layer) based on any one among amorphous silicon, polycrystalline silicon, oxide, and organic materials.

As another embodiment, some thin film transistors among the first switching thin film transistor Tsw1, the second switching thin film transistor Tsw2, and the driving thin film transistor Tdr may include a semiconductor layer based on a low-temperature polycrystalline silicon material having the good response characteristics, and the remaining thin film transistors thereof may be the thin film transistor including a semiconductor layer based an oxide material having the good off-current characteristics.

The first switching thin film transistor Tsw1 may include a gate electrode coupled to a first gate line (GLa) of the gate line GL, a first source/drain electrode connected with the close data line DL, and a second source/drain electrode connected with a first node n1 corresponding to a gate electrode of the driving thin film transistor Tdr. The first switching thin film transistor Tsw1 may supply a data voltage, which is supplied to the data line DL in accordance with a first gate signal GSa having a gate-on voltage level supplied to the first gate line GLa, to the first node n1 corresponding to the gate electrode of the driving thin film transistor Tdr.

The second switching thin film transistor Tsw2 may include a gate electrode coupled to a second gate line GLb of the gate line GL, a first source/drain electrode coupled to adjacent reference line RL, and a second source/drain electrode connected with a second node (n2) corresponding to a source electrode of the driving thin film transistor Tdr. The second switching thin film transistor Tsw2 may supply a reference voltage Vref, which is supplied to the reference line RL in accordance with a second gate signal Gsb having a gate-on voltage level supplied to the second gate line GLb, to the second node n2 corresponding to the source electrode of the driving thin film transistor Tdr.

The capacitor Cst may be provided between the gate electrode of the driving thin film transistor Tdr and the source electrode of the driving thin film transistor Tdr. The capacitor Cst according to an embodiment of the present disclosure may include a first capacitor electrode comprising the gate electrode of the driving thin film transistor Tdr, a second capacitor electrode comprising the source electrode of the driving thin film transistor Tdr, and a dielectric layer provided in an overlap area between the first capacitor electrode and the second capacitor electrode. After the capacitor Cst is charged with a differential voltage between the gate electrode of the driving thin film transistor Tdr and the source electrode of the driving thin film transistor Tdr, the capacitor Cst may switch the driving thin film transistor Tdr in accordance with the charged voltage.

The driving thin film transistor Tdr may include a gate electrode coupled to the second source/drain electrode of the first switching thin film transistor Tsw1 and the first capacitor electrode of the capacitor Cst in common, a source electrode coupled to the first source/drain electrode of the second switching thin film transistor Tsw2, the second capacitor electrode of the capacitor Cst, and the light emitting device layer EDL in common, and a drain electrode coupled to the pixel driving power line PL. According as the driving thin film transistor Tdr is turned-on by a voltage of the capacitor Cst, it is possible to control an amount of current flowing from the pixel driving power line PL to the light emitting device layer EDL.

The light emitting device layer EDL may emit light in proportion to a data current flowing from the pixel driving power line PL to low-potential power source VSS in accordance with the driving of the pixel circuit PC. The light emitting device layer EDL according to an embodiment of the present disclosure may include a first electrode, a self-light emitting portion EP, and a second electrode. For example, the light emitting device layer EDL may be referred to as a light emitting device, a light emitting portion, or a spot light source, but embodiments of the present disclosure are not limited thereto.

The first electrode may be electrically coupled (or connected) to the source electrode of the driving thin film transistor Tdr of the pixel circuit PC. The first electrode may be referred to as an anode electrode, a pixel electrode, or a transparent electrode, but embodiments of the present disclosure are not limited thereto.

The self-light emitting portion EP may be provided at the first electrode. The self-light emitting portion EP according to an embodiment of the present disclosure may be individually provided in each of the plurality of pixels 12a, 12b, 12c, and 12d. for example, the self-light emitting portion EP of each pixel 12a, 12b, 12c, and 12d may emit the different colored light. The self-light emitting portion EP according to another embodiment of the present disclosure may be provided for the plurality of pixels 12a, 12b, 12c, and 12d in common. For example, the self-light emitting portion EP in each pixel 12a, 12b, 12c, and 12d may emit the same colored light of white colored light.

The self-light emitting portion EP according to an embodiment of the present disclosure may include at least one light emitting layer formed in a single-layered structure or a multi-layered structure. The at least one light emitting layer may include any one of an organic light emitting layer, a quantum dot light emitting layer, and an inorganic light emitting layer. For example, the self-light emitting portion EP may include two or more organic light emitting layers disposed between the first electrode and the second electrode and configured to emit the different colored light.

The second electrode may be provided at the self-light emitting portion EP. The second electrode may be coupled (or connected) to the plurality of pixels 12a, 12b, 12c, and 12d in common, but embodiments of the present disclosure are not limited thereto. For example, the second electrode may be referred to as a cathode electrode, a common electrode, or a reflective electrode, but embodiments of the present disclosure are not limited thereto.

In the above embodiment of the present disclosure, the pixel circuit PC comprises the three transistors and one capacitor. However, the number of transistors and capacitors configuring the pixel circuit PC may variously modified. For example, the pixel circuit PC of the pixel 12a, 12b, 12c, and 12d may include a driving thin film transistor Tsw, a switching thin film transistor Tsw, and a capacitor Cst.

Figure 3:
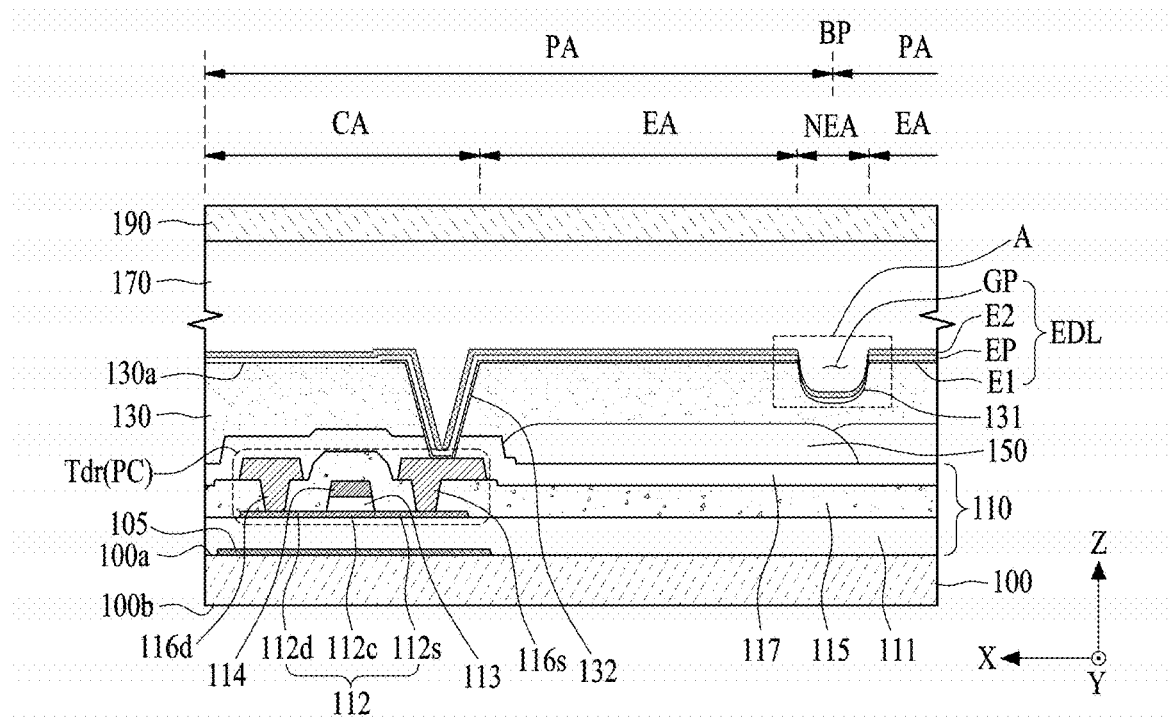
FIG. 3 is a cross sectional view illustrating a cross-sectional structure of a pixel according to an embodiment of the present disclosure.
Figure 4:
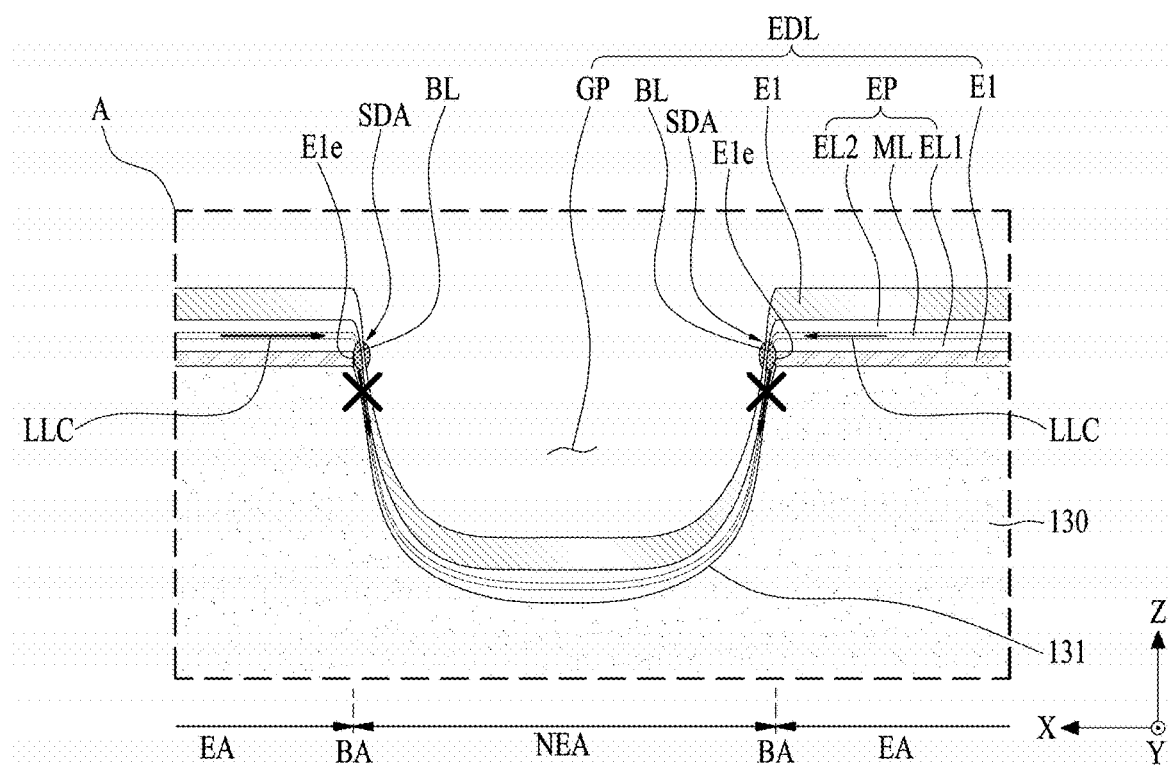
FIG. 4 is an expanded view showing 'A' shown in FIG. 3.

FIG. 3 is a cross sectional view illustrating a cross-sectional structure of a pixel according to an embodiment of the present disclosure, and FIG. 4 is an expanded view illustrating 'A' shown in FIG. 3.

Referring to FIGS. 3 and 4, the display panel 10 (or light emitting display apparatus) according to an embodiment of the present disclosure may include a substrate 100, a circuit layer 110, a planarization layer 130, and a light emitting device layer EDL.

The substrate 100 may be generally formed of a glass material, but not limited to this material. The substrate 100 may be formed of a curvable or bendable transparent plastic material. For example, substrate 100 may be formed of a polyimide, but embodiments of the present disclosure are not limited thereto.

The substrate 100 may include a plurality of pixel areas PA defined on the display area.

Each of the plurality of pixels areas PA may include an emission area EA, a circuit area CA, and a non-emission area NEA.

The emission area EA may be defined as the remaining portions of the pixel area PA except the non-emission area NEA. For example, the emission area EA may be disposed at one side of the pixel area PA. For example, the emission area EA may be disposed at an upper side of the pixel area PA.

The circuit area CA may be spatially separated from the emission area EA inside the pixel area PA. For example, the circuit area CA may be disposed at the other side of the pixel area PA. For example, the circuit area CA may be disposed at a lower side of the pixel area PA.

The non-emission area NEA may be disposed between the two pixel areas PA adjacent to each other along the first direction X and the second direction Y. Also, the non-emission area NEA may be disposed between the emission area EA and the circuit area CA inside one pixel area PA. The non-emission area NEA may include the circuit area CA. For example, the emission area EA may be referred to as an opening area, an opening portion, a light emitting area, or a light emitting portion. The non-emission area NEA may be referred to as a non-opening area.

The circuit layer 110 may be disposed at a first surface 100a of the substrate 100. The circuit layer 110 according to an embodiment of the present disclosure may include a buffer layer 111, a pixel circuit PC, and a protection layer 117.

The buffer layer 111 may be disposed at an entire area of the first surface 100a of the substrate 100. The buffer layer 111 may prevent materials contained in the substrate 100 from spreading to a transistor layer for a high-temperature step of a process for manufacturing the thin film transistor, or may prevent external water or moisture from being permeated into an emission device. The buffer layer 111 may be formed of a silicon oxide or a silicon nitride. Selectively, it is possible to omit the buffer layer 110 in some embodiments.

The pixel circuit PC may be disposed at the circuit area CA in each of the plurality of pixel areas PA. The pixel circuit PC according to an embodiment of the present disclosure may include a driving thin film transistor Tdr.

The driving thin film transistor Tdr may include an active layer 111, a gate insulating film 113, a gate electrode 114, an insulating interlayer 115, a drain electrode 116d, and a source electrode 116s.

The active layer 112 may include a channel region 112c, a drain region 112d, and a source region 112s provided at a driving thin film transistor area of the circuit area CA. The drain region 112d and the source region 112s may be spaced apart from each other in parallel with the channel region 112c interposed therebetween.

The active layer 112 may be formed of a semiconductor material based on any one of amorphous silicon, polycrystalline silicon, oxide, or organic material, but embodiments of the present disclosure are not limited thereto.

The gate insulating film 113 may be provided at the channel region 112c of the active layer 112. As an example, the gate insulating film 113 may be provided in an island shape only on the channel region 112c of the active layer 112. As another embodiment, the gate insulating film 113 may be provided at an entire front surface of the buffer layer 110 or substrate 100 including the active layer 112.

The gate electrode 114 may be provided at the gate insulating film 113 to be overlapped with the channel region 112c of the active layer 112. For example, the gate electrode 114 may be formed in a single-layered structure of a metal material or an alloy, or a multi-layered structure of two or more metal materials or alloys.

The insulating interlayer 115 may be provided at the gate electrode 114, and the drain region 112d and source region 112s of the active layer 112. The insulating interlayer 115 may be provided at the entire areas of the emission area EA, the circuit area CA, and the non-emission area NEA. For example, the insulating interlayer 115 may be formed of an inorganic material such as silicon oxide (SiOx) or silicon nitride (SiNx), or an organic material such as benzocyclobutene or photo acryl.

The drain electrode 116d may be electrically coupled to the drain region 112d of the active layer 112 via a drain contact hole prepared in the insulating interlayer 115 overlapped with the drain region 112d of the active layer 112.

The source electrode 116s may be electrically coupled to the source region 112s of the active layer 112 via a source contact hole prepared in the insulating interlayer 115 overlapped with the source region 112s of the active layer 112.

The drain electrode 116d and the source electrode 116s may be formed of the same metal material. For example, each of the drain electrode 116d and the source electrode 116s may be formed in a single-layered structure of a metal material which is the same as or different from that of the gate electrode, a single-layered structure of an alloy which is the same as or different from that of the gate electrode, or a multi-layered structure of metal materials which are same as or different from those of the gate electrode.

Additionally, the pixel circuit portion may further include a capacitor, and first and second switching thin film transistors disposed at the circuit area CA together with the driving thin film transistor Tdr. Each of the first and second switching thin film transistors is prepared on the circuit area CA of the pixel area PA, wherein each of the first and second switching thin film transistors is embodied to have the same structure as the driving thin film transistor Tdr. A detailed description for this structure will be omitted. The capacitor may be prepared on an overlap area between the gate electrode 114 and the source electrode 116s which overlap each other with the insulating interlayer 115 interposed in-between and are included in the driving thin film transistor Tdr.

Additionally, the thin film transistor prepared in the pixel circuit portion may have the properties related with a shift of a threshold voltage by light. To prevent this phenomenon, the display panel or first substrate 100 may further include a light shielding layer 105 prepared below the active layer 112 of at least one of the driving thin film transistor Tdr, the first switching thin film transistor, or the second switching thin film transistor. The light shielding layer 105 is prepared between the substrate 100 and the active layer 112, and the light shielding layer 105 prevents light which is incident on the active layer 112 through the substrate 100, to thereby minimize or prevent the change of threshold voltage in the transistor caused by the external light.

The protection layer 117 may be prepared on the substrate 100 and configured to overlay (or cover) the pixel circuit portion. The protection layer 117 may be configured to overlay (or cover) the drain electrode 116d of the driving thin film transistor Tdr, the source electrode 116s of the driving thin film transistor Tdr, and the insulating interlayer 115. The protection layer 117 may be provided at the entire area of the emission area EA, the circuit area CA, and the non-emission area NEA. For example, the protection layer 117 may be formed of an inorganic material such as silicon oxide (SiOx) or silicon nitride (SiNx). Selectively, the protection layer 17 may be referred to as a passivation layer. It is possible to omit the protection layer 130 in some embodiments.

The planarization layer 130 may be provided at the substrate 100 and configured to overlay (or cover) the protection layer 117. When the protection layer 117 is omitted, the planarization layer 130 may be prepared on the substrate 100 so as to overlay (or cover) the circuit layer 110. The planarization layer 130 may be provided at the entire areas of the emission area EA, the circuit area CA, and the non-emission area NEA.

Also, the planarization layer 130 may be configured to have a relatively large thickness and may provide a planar surface of the display area AA. For example, the planarization layer 130 may be formed of an organic material such as photo acryl, benzocyclobutene, polyimide, or fluoric resin.

The planarization layer 130 according to an embodiment of the present disclosure may include a groove 131 disposed in the non-emission area NEA of the pixel area PA.

The groove 131 may be concavely provided to have a predetermined depth from an upper surface (or planar surface) 130a of the planarization layer 130 disposed in the non-emission area NEA of the pixel area PA. The groove 131 may prevent or minimize a color mixture between the two adjacent pixel areas PA. For example, the groove 131 may reflect light from the first pixel area of the two adjacent pixel areas PA toward the first pixel area, and may reflect light from the second pixel area of the two adjacent pixel areas PA toward the second pixel area. For example, the groove 131 may be referred to as a color mixture prevention structure, a light reflection structure, or a light path change structure, but embodiments of the present disclosure are not limited thereto.

The groove 131 according to an embodiment of the present disclosure may be disposed between the two adjacent pixel areas PA along the first direction X and the second direction Y. The groove 131 may be disposed in the boundary portion (BP) or at the periphery of the boundary portion (BP) between the two adjacent pixel areas PA along the first direction X and the second direction Y. For example, the groove 131 may be disposed in the boundary portion (BP) or on the periphery of the boundary portion (BP) between the emission areas EA of the two adjacent pixel areas PA along any one direction of the first direction X and the second direction Y. For example, the groove 131 may be shared in the two adjacent pixel areas PA along one or more direction among the first direction X and the second direction Y.

The groove 131 according to an embodiment of the present disclosure may be concavely provided from the planarization layer 130 at the periphery of the emission area EA of the pixel area PA. According as the groove 131 is concavely provided from the planarization layer 130 disposed in the emission area EA of the pixel area PA, it is possible to define at least a portion of the emission area EA of the pixel area PA. For example, the groove 131 may define at least two sides of first to fourth sides of the emission area EA. Thus, according as the emission area EA of the pixel area PA is defined by the groove 131, it is possible to omit a separate bank layer or a pixel definition film configured to define the emission area EA of the pixel area PA, to thereby improve an aperture ratio of the pixel.

The light emitting device layer EDL may be disposed at the planarization layer 130 above the emission area EA of the pixel area PA. According to a bottom emission type, the light emitting device layer EDL may emit light toward the substrate 100. The light emitting device layer EDL according to an embodiment of the present disclosure may include a first electrode E1, a self-light emitting portion EP, and a second electrode E2.

The first electrode E1 is provided above the planarization layer 130 of the pixel area PA, and the first electrode E1 may be electrically coupled (or connected) to the source electrode 116s of the driving thin film transistor Tdr.

The first electrode E1 may be configured to have a planar surface structure in the remaining portions except an electrical connection portion with the driving thin film transistor Tdr. For example, the remaining portions of the first electrode E1 except the electrical connection portion with the driving thin film transistor Tdr directly contact the upper surface 130a of the planarization layer 130 on the emission area EA of the pixel area PA so that the first electrode E1 may have the same planar surface structure as the upper surface 130a of the planarization layer 130. And, the electrical connection portion with the driving thin film transistor Tdr in the first electrode E1 may have a concave structure (or a recess structure). Except the groove 131 of the planarization layer 130 and the electrical connection portion with the driving thin film transistor Tdr, the first electrode E1 may be disposed at the upper surface 130a of the planarization layer 130.

One side portion (or one end) of the first electrode E1 is disposed at the planarization layer 130 of the circuit area CA to be overlapped with the source electrode 116s of the driving thin film transistor Tdr, and may be electrically coupled (or connected) to the source electrode 116s of the driving thin film transistor Tdr via an electrode contact hole 132 prepared in the planarization layer 130 and the protection layer 117. For example, the one side portion of the first electrode E1 extends onto the source electrode 116s of the driving thin film transistor Tdr, and then may be electrically coupled (or connected) to the source electrode 116s of the driving thin film transistor Tdr via the electrode contact hole 132. For example, the first electrode E1 may include an extending portion disposed between the emission area EA and the circuit area CA in each pixel area PA.

The other side portion (or other end) of the first electrode E1 may be positioned (or aligned) at the end of the emission area EA of the pixel area PA, or may be positioned (or aligned) at the boundary between the emission area EA and the non-emission area NEA.

The self-light emitting portion EP may be disposed at the first electrode E1 and the planarization layer 130 above the pixel area PA.

The self-light emitting portion EP according to an embodiment of the present disclosure may be configured to surround the entire first electrode E1. For example, the self-light emitting portion EP may be configured to surround an upper surface and all lateral surfaces (or sidewalls) of the first electrode E1.

The self-light emitting portion EP according to another embodiment of the present disclosure may be disposed at the emission area EA, the non-emission area NEA, and the circuit area CA in each pixel area PA. For example, the self-emission portion EP may be configured to overlay (or cover) the first electrode E1, the upper surface 130a of the planarization layer 130, and the groove 131.

The self-light emitting portion EP includes two or more light emitting layers (or stack layers) EL1 and EL2 configured to emit white colored light. As an example, the self-light emitting portion EP may include a first light emitting layer (or first stack layer) EL1 and a second light emitting layer (or second stack layer) EL2 configured to emit white colored light by a mixture of first light and second light. For example, the first light emitting layer EL1 may include any one selected from a blue light emitting layer, a green light emitting layer, a red light emitting layer, a yellow light emitting layer, or a yellow-green light emitting layer so as to emit the first light. For example, the second light emitting layer EL2 may include a light emitting layer capable of emitting the second light so as to obtain white colored light in the self-light emitting portion EP by a mixture with the first light of a blue light emitting layer, a green light emitting layer, a red light emitting layer, a yellow light emitting layer, or a yellow-green light emitting layer.

The self-light emitting portion EP according to an embodiment of the present disclosure may further include a hole transport layer and an electron transport layer. For example, the self-light emitting portion EP may further include a first hole transport layer between the first electrode E1 and the first light emitting layer EL1, a first electron transport layer between the first light emitting layer EL1 and the second light emitting layer EL2, a second hole transport layer between the first electron transport layer and the second light emitting layer EL2, and a second electron transport layer between the second light emitting layer EL2 and the second electrode E2. For example, in the self-light emitting portion EP, the first hole transport layer, the first light emitting layer EL1, and the first electron transport layer may be referred to as a first stack layer, and the second hole transport layer, the second light emitting layer EL2, and the second electron transport layer may be referred to as a second stack layer.

The self-light emitting portion EP according to an embodiment of the present disclosure may further include a middle layer ML disposed between the first light emitting layer EL1 and the second light emitting layer EL2.

The middle layer ML may be interposed between the first light emitting layer EL1 and the second light emitting layer EL2. The middle layer ML according to an embodiment of the present disclosure may adjust a charge balance between the first light emitting layer EL1 and the second light emitting layer EL2. For example, the middle layer ML may be referred to as a charge generation layer. For example, the middle layer ML may include a first type charge generation layer and a second type charge generation layer. For example, the middle layer ML may include an N-type charge generation layer and a P-type charge generation layer.

The self-light emitting portion EP according to an embodiment of the present disclosure may further include a third light emitting layer (or third stack layer). The third light emitting layer may be disposed between the second light emitting layer EL2 and the second electrode E2. The third light emitting layer may include a light emitting layer which is selected from any one of a blue light emitting layer, a green light emitting layer, a red light emitting layer, a yellow light emitting layer, or a yellow-green light emitting layer, and which is identical to or different from that of the first light emitting layer EL1.

The second electrode E2 may be provided at the self-light emitting portion EP, or may directly contact the self-light emitting portion EP. According as the second electrode E2 is provided (or deposited) at the self-light emitting portion EP, the second electrode E2 may have a surface morphology corresponding to a surface morphology of the self-light emitting portion EP. For example, the second electrode E2 is formed in a conformal shape corresponding to the surface shape (or morphology) of the self-light emitting portion EP by a deposition process, whereby the second electrode E2 may have the same cross-sectional structure as the self-light emitting portion EP. For example, the second electrode E2 may have a planar structure in the emission area EA of each pixel area PA, and may have a concave structure according to the shape of the groove 131 or may have a convex structure (or a protruding structure) toward the substrate 100 in the non-emission area NEA of each pixel area PA. The second electrode E2 disposed at the groove 131 may be referred to as a light path prevention structure, a color mixture prevention structure, or a light reflection structure configured to prevent or minimize a color mixture between the two adjacent emission areas EA.

The second electrode E2 according to an embodiment of the present disclosure may include a metal material having a high reflectance so as to reflect the incident light emitted from the light emitting device layer EDL toward the substrate 100. For example, the second electrode E2 may include a single-layered structure or multi-layered structure of any one material selected from aluminum (Al), argentums (Ag), molybdenum (Mo), aurum (Au), magnesium (Mg), calcium (Ca), or barium (Ba), or alloy of two or more materials selected from aluminum (Al), argentums (Ag), molybdenum (Mo), aurum (Au), magnesium (Mg), calcium (Ca), or barium (Ba).

The light emitting device layer EDL may further include a groove portion GP disposed at the non-emission area NEA of the substrate 100.

The groove portion GP may be concavely provided between the two adjacent pixel areas PA or may be concavely provided at the boundary area between the two adjacent pixel areas PA. For example, the groove portion GP may include the second electrode E2 concavely provided between the emission areas EA of the two adjacent pixel areas PA, whereby it is possible to prevent or minimize a color mixture between the two adjacent emission areas EA by the light reflection of the concavely-provided second electrode E2. For example, when the first pixel area and the second pixel area are close to each other, the groove portion GP may prevent the light from advancing toward the second pixel area PA by reflecting the light emitted from the emission area EA of the first pixel area PA to the first pixel area PA, or may prevent the light from advancing toward the first pixel area PA by reflecting the light emitted from the emission area EA of the second pixel area PA to the second pixel area PA. For example, the groove portion GP including the second electrode E2 provided concavely or protruding toward the substrate 100 may be referred to as a light path prevention structure, a color mixture prevention structure, or a light reflection structure. For example, the groove portion GP may be overlapped with the groove 131.

The light emitting device layer EDL according to an embodiment of the present disclosure may further include a barrier layer (or metal oxide layer) BL.

The barrier layer BL according to an embodiment of the present disclosure may be disposed at the boundary area BA between the emission area EA and the non-emission area NEA of the pixel area PA. For example, the barrier layer BL may be disposed between the first electrode E1 and the second electrode E2 above the boundary area BA between the emission area EA and the non-emission area NEA. For example, the barrier layer BL may electrically disconnect or separate the self-light emitting portion EP at the boundary area BA. For example, the barrier layer BL may be disposed at the periphery area of the boundary area BA between the groove 131 and the upper surface 130a of the planarization layer 130.

The barrier layer BL according to an embodiment of the present disclosure may be disposed at the periphery of an end lateral surface E1e of the first electrode E1. For example, the barrier layer BL may be disposed at the periphery of the end lateral surface E1e of the first electrode E1 adjacent to the groove 131. For example, the barrier layer BL may be disposed at the periphery of the end lateral surface E1e of the first electrode E1 which is close to the groove portion GP of the light emitting device layer EDL.

The barrier layer BL according to an embodiment of the present disclosure may be disposed between the end lateral surface E1e of the first electrode E1 and the second electrode E2. For example, the barrier layer BL may be disposed between the second electrode E2 and the end lateral surface E1e of the first electrode E1 adjacent to the groove 131. For example, the barrier layer BL may be disposed between the second electrode E2 and the end lateral surface E1e of the first electrode E1 overlapped with the groove portion GP.

The barrier layer BL according to an embodiment of the present disclosure may be disposed at the periphery area of a short distance area SDA between the first electrode E1 and the second electrode E2. For example, the barrier layer BL may be disposed at the periphery area of the shortest distance area SDA between the second electrode E2 and the first electrode E1 adjacent to the groove 131.

The barrier layer BL according to an embodiment of the present disclosure may include a metal oxide. For example, the barrier layer BL may be formed based on a material of the second electrode E2, whereby the barrier layer BL may be a second electrode oxide layer. For example, when the second electrode E2 is formed of an aluminum material, the barrier layer BL may include an aluminum oxide ($Al_2O_3$).

The barrier layer BL according to an embodiment of the present disclosure may be formed by a bias voltage applied to the light emitting device layer EDL in an oxidizing atmosphere. The barrier layer BL may be formed by an aging process configured to apply a reverse bias voltage applied to the first electrode E1 and the second electrode E2 in an oxygen atmosphere, but embodiments of the present disclosure are not limited thereto. For example, the aging process may form a non-conductive oxide (or metal oxide layer) in an area where the first electrode E1 and the second electrode E2 are electrically shorted due to a small thickness of the light emitting portion EP. For example, when the light emitting portion EP is provided to have a small thickness at an end of the first electrode E1 and the second electrode E2 is provided above the light emitting portion EP, the first electrode E1 and the second electrode E2 may be electrically shorted to each other in the end of the first electrode E1. Thus, when the reverse bias voltage is applied to the first electrode E1 and the second electrode E2 in an oxidization atmosphere (or oxygen atmosphere), an oxidization phenomenon of the second electrode E2 occurs in the area where the first electrode E1 and the second electrode E2 are electrically shorted and a peripheral area thereof, whereby the barrier layer (or metal oxide layer) BL with non-conductivity may be formed in a short-circuitable area between the first electrode E1 and the second electrode E2 and a peripheral area thereof.

According to an embodiment of the present disclosure, the barrier layer BL may be formed at a predetermined direction with respect to the shortest distance area (or closest area) SDA between the first electrode E1 and the second electrode E2 in accordance with the aging process. For example, the barrier layer BL may be formed in a radial shape with respect to the shortest distance area SDA between the first electrode E1 and the second electrode E2. For example, the barrier layer BL may be provided in the entire area between the first electrode E1 and the second electrode E2 confronting (or facing) each other with the self-emitting portion EP interposed therebetween in the shortest distance area SDA between the first electrode E1 and the second electrode E2. In the shortest distance area SDA between the first electrode E1 and the second electrode E2, the barrier layer BL may be provided in the entire area between the first electrode E1 and one side of the second electrode E2 which contacts the self-light emitting portion EP, and may be additionally provided with a constant thickness at the other side of the second electrode E2 which is opposite to one side of the second electrode E2. For example, the barrier layer BL may be provided with a constant thickness at one or more among one side of the second electrode E2 and the other side of the second electrode E2 in the shortest distance area SDA between the first electrode E1 and the second electrode E2.

The barrier layer BL according to an embodiment of the present disclosure grows from the surface of the second electrode E2 to the first electrode E1 in accordance with the aging process, whereby the barrier layer BL may physically contact or physically directly contact the first electrode E1 through or pass the self-light emitting portion EP. The self-light emitting portion EP may be electrically separated or disconnected by the barrier layer BL. For example, the self-light emitting portion EP may be electrically separated or disconnected by the barrier layer (BP) in the boundary area BA between the emission area EA and the non-emission area NEA of the pixel area PA, whereby the self-light emitting portion EP may be electrically separated or disconnected every pixel area PA.

The barrier layer BL according to an embodiment of the present disclosure may prevent a lateral-surface leakage current LLC flowing in a lateral surface direction inside the self-light emitting portion EP for a light emission of the light emitting device layer EDL. For example, in the self-light emitting portion EP having the two or more light emitting layers EL1 and EL2, there might be the lateral-surface leakage current LLC which flows toward close another pixel area PA through a layer between the light emitting layers EL1 and EL2, wherein the lateral-surface leakage current LLC may be prevented by the barrier layer BL. Accordingly, the light emitting display apparatus according to the present disclosure may prevent the lateral-surface leakage current LLC between the adjacent pixels by the use of barrier layer BL so that it is possible to minimize or prevent a color realization ratio, a picture quality, and a resolution from being deteriorated by an abnormal light emission (or erroneous light emission) in the non-emission area. Especially in a low-grayscale area, it is possible to minimize or prevent a color realization ratio, a picture quality, and a resolution from being deteriorated. Also, in the light emitting display apparatus according to the present disclosure, as the lateral-surface leakage current LLC between the adjacent pixels is prevented, the generation of the consumption current may be prevented or reduced and an emission efficiency of the self-light emitting portion EP may be increased or maximized.

The display panel 10 (or light emitting display apparatus) according to an embodiment of the present disclosure may further include a wavelength conversion layer 150. The wavelength conversion layer 150 may be disposed between the substrate 100 and the planarization layer 130 to be overlapped with the emission area EA of at least one of the plurality of pixel areas PA.

The wavelength conversion layer 150 according to an embodiment of the present disclosure may be disposed between the circuit layer 110 and the planarization layer 130 to be overlapped with the emission area EA. For example, the wavelength conversion layer 150 overlapped with the emission area EA may be disposed in any one area between the protection layer 117 and the planarization layer 130, between the insulating interlayer 115 and the protection layer 117, or between the substrate 100 and the insulating interlayer 115.

The wavelength conversion layer 150 may have the same size or a relatively large size than the emission area EA. For example, the wavelength conversion layer 150 may be relatively larger than the light emission area EA.

The wavelength conversion layer 150 according to the first embodiment of the present disclosure includes a color filter which transmits only the wavelength having a color preset in the pixel from the light emitted from the self-light emitting portion EP toward the substrate 100. For example, the wavelength conversion layer 150 may transmit only the red wavelength, green wavelength, or blue wavelength. As an embodiment, in the light emitting display apparatus according to the present disclosure, when the one unit pixel comprises the adjacent first to third pixels, the wavelength conversion layer prepared in the first pixel may include a red color filter, the wavelength conversion layer prepared in the second pixel may include a green color filter, and the wavelength conversion layer prepared in the third pixel may include a blue color filter. Additionally, in the light emitting display apparatus according to the present disclosure, the one unit pixel may further include a white pixel without the wavelength conversion layer. For example, the one unit pixel may further include a white pixel in which a wavelength conversion layer is not formed.

The wavelength conversion layer 150 according to the second embodiment of the present disclosure may include a quantum dot having a size capable of re-emitting light according to light emitted from the light emitting element ED to the substrate 100 and discharging light of a color which is set for the pixel. For example, the quantum dot may be selected from CdS, CdSe, CdTe, CdZnSeS, ZnS, ZnSe, GaAs, GaP, GaAs—P, Ga—Sb, InAs, InP, InSb, AlAs, AlP, or AlSb. For example, the wavelength conversion layer of the first pixel may include a quantum dot of CdSe or InP, the wavelength conversion layer of the second pixel may include a quantum dot of CdZnSeS, and the wavelength conversion layer of the third pixel may include a quantum dot of ZnSe. Thus, the light emitting display apparatus in which the wavelength conversion layer 150 includes quantum dots may realize high color realization ratio (or the color gamut).

The wavelength conversion layer 150 according to the third embodiment of the present disclosure may include a color filter having a quantum dot.

The wavelength conversion layer 150 according to an embodiment of the present disclosure may be overlapped with the area between the adjacent pixel areas PA. For example, the wavelength conversion layer 150 disposed in each pixel area PA may be overlapped with another wavelength conversion layer 150 disposed in another pixel area PA in the non-emission area NEA of the adjacent pixel area PA. For example, the wavelength conversion layer 150 disposed in each pixel area PA and another wavelength conversion layer 150 disposed in another adjacent pixel area PA may be overlapped with each other under (or below) the groove 131 of the planarization layer 130. The overlap area between the wavelength conversion layers 150 disposed in the adjacent pixel areas PA may function as a color mixture prevention area between the adjacent pixels. For example, the overlap area between the wavelength conversion layers 150 may be referred to as a light blocking layer, a light blocking portion, a light shield pattern, or a light shield portion.

The display panel 10 (or light emitting display apparatus) according to an embodiment of the present disclosure may further include an encapsulation layer 170.

The encapsulation layer 170 may be disposed at the display area AA of the substrate 100 to overlay (or cover) the light emitting device layer EDL. The encapsulation layer 170 protects the thin film transistor and self-emitting device SED from an external shock, and may prevent oxygen or/and moisture, and furthermore particles from being permeated into the light emitting device layer EDL.

The encapsulation layer 170 according to an embodiment of the present disclosure may include at least one inorganic film configured to overlay (or cover) the entire display area AA. And, the encapsulation layer 170 may further include at least one organic film. For example, the encapsulation layer 170 may include a first inorganic encapsulation layer, an organic encapsulation layer, and a second inorganic encapsulation layer. For example, the organic encapsulation layer may be a particle cover layer having a relatively large thickness so as to prevent the light emitting device layer EDL from being damaged by particles.

The encapsulation layer 170 according to an embodiment of the present disclosure may include a filling material (or adhesive member) configured to surround the entire display area AA and disposed at the substrate 100. The filling material may include a thermo-curable transparent adhesive or a photo-curable transparent adhesive. Additionally, the filling material may contain an absorbing material (or getter material) configured to absorb oxygen or/and moisture permeating into the self-light emitting portion EP.

The display panel 10 (or light emitting display apparatus) according to the present disclosure may further include a cover substrate 190 (or opposite substrate) attached onto the substrate 100 by the use of filling material.

The cover substrate 190 may be an opaque glass substrate, an opaque plastic substrate, or an opaque metal substrate. For example, the cover substrate 190 may be an opaque metal substrate.

The cover substrate 190 may have a relatively large size so as to prevent an overflow of the encapsulation layer 170 in consideration of a margin of a substrate bonding process. For example, each lateral surface (or sidewall) of the encapsulation layer 170 may be covered by the cover substrate 190. For example, each lateral surface (or sidewall) of the cover substrate 190 may protrude from each lateral surface (or sidewall) of the encapsulation layer 170 toward an external direction.

The display panel 10 (or light emitting display apparatus) according to the present disclosure may further include an optical film disposed at the first substrate 100.

The optical film may be disposed at a second surface 100b which is opposite to a first surface 100a of the first substrate 100. The second surface 100b of the first substrate 100 may be a rear surface of the first substrate 100 or a light extraction surface.

The optical film may further include a polarizing film attached to the second surface 100b of the substrate 100. The polarizing film changes the external light reflected by the thin film transistor and/or lines prepared in the pixel into a circular-polarized state, to thereby improve visibility and contrast ratio of the light emitting display apparatus. For example, the polarizing film may be embodied in a circular-polarizing film.

Accordingly, the light emitting display apparatus according to an embodiment of the present disclosure may prevent a leakage current between the adjacent pixels by the use of barrier layer BL disposed at the non-emission area NEA of each pixel area PA, and may also prevent a color mixture between the adjacent pixels. Also, in case of the light emitting display apparatus according to an embodiment of the present disclosure, the emission area EA of each pixel area PA may be defined by the groove 131 disposed at the non-emission area NEA of each pixel area PA so that it is possible to improve an aperture ratio of each pixel and also to prevent a picture quality from being deteriorated by a leakage current between the adjacent pixels.

Figure 5:
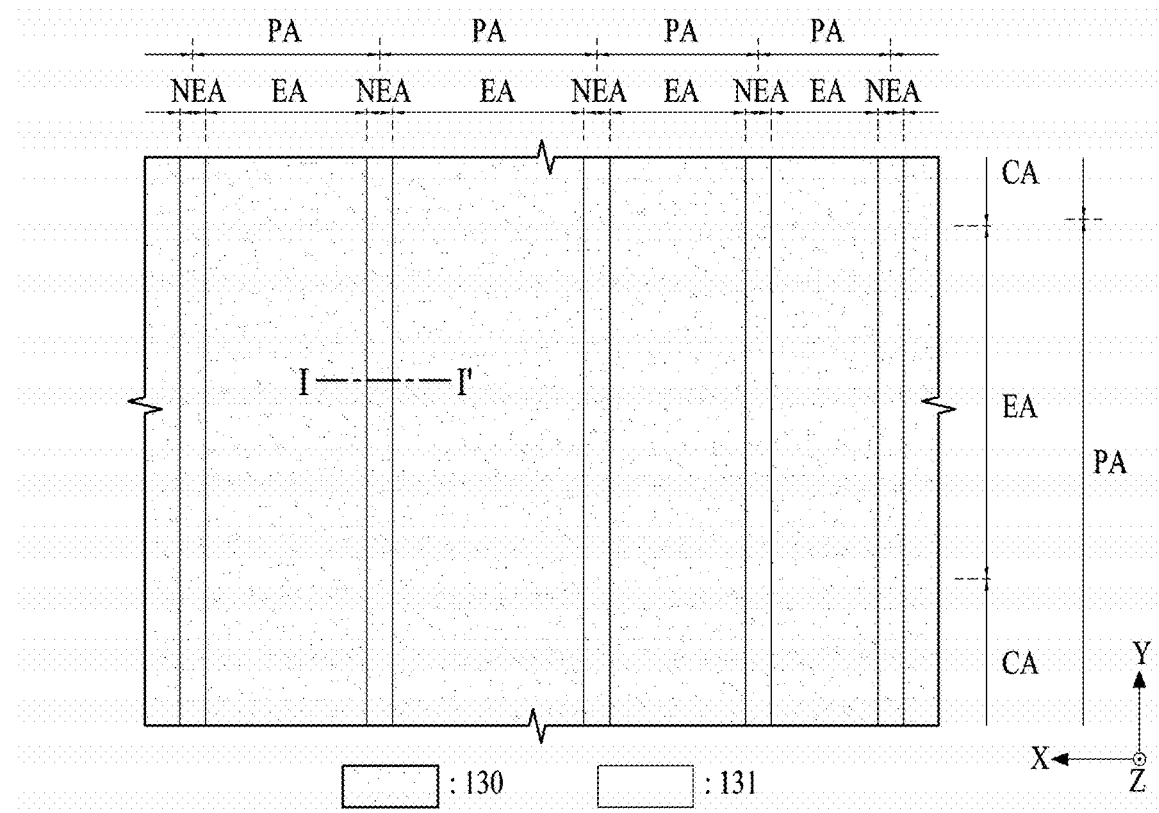
FIG. 5 is a plan view illustrating a groove according to an embodiment of the present disclosure.
Figure 6:
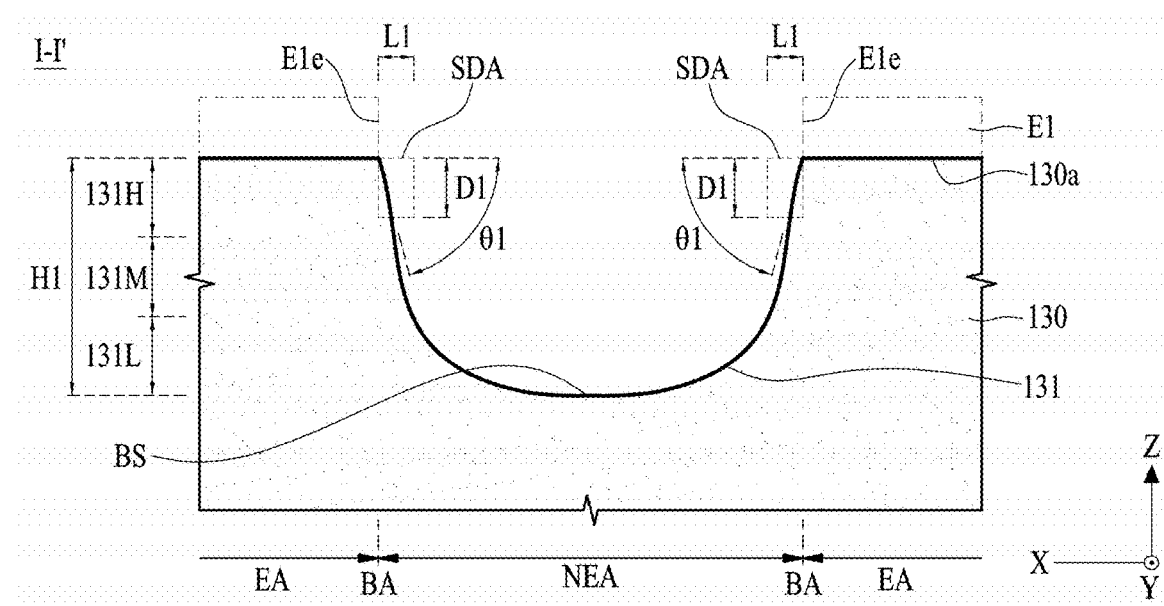
FIG. 6 is a cross sectional view along I-I' of FIG. 5.

FIG. 5 is a plan view illustrating a groove according to an embodiment of the present disclosure, and FIG. 6 is a cross sectional view along I-I' of FIG. 5.

Referring to FIGS. 4 to 6, the groove 131 according to an embodiment of the present disclosure may be concavely provided or formed at the planarization layer 130 between the two adjacent pixel areas PA.

The groove 131 according to an embodiment of the present disclosure may be concavely provided from the planarization layer 130 between the two adjacent pixel areas PA along the first direction X. For example, the groove 131 may be concavely provided at the planarization layer 130 between the two adjacent pixel areas PA along the first direction X so as to have a line shape (or vertical line shape) parallel to the second direction Y which is intersects or transverse to the first direction X. For example, the groove 131 may be concavely formed from one side (or right side) of the first pixel area and the other side (or left side) of the second pixel area among the two adjacent pixel areas PA along the first direction X. The groove 131 is disposed between the emission areas EA of the two adjacent pixel areas PA to each other along the first direction X, and thus, The groove 131 may define the emission area EA of the adjacent pixel areas PA along the first direction X, or may implement the non-emission area NEA between the adjacent pixel areas PA along the first direction X. And, the groove 131 according to an embodiment of the present disclosure is concavely provided at the predetermined depth D1, thereby preventing or minimizing a color mixture between the two adjacent pixel areas PA along the first direction X.

The groove 131 according to an embodiment of the present disclosure may include an upper area 131H, a middle area 131M, and a lower area 131L.

The upper area 131H may include an upper portion of the groove 131 adjacent to or closest to the upper surface 130a of the planarization layer 130 or the first electrode E1. The lower area 131L may include a lower portion of the groove 131 having a bottom surface BS of the groove 131 disposed farthest from the upper surface 130a of the planarization layer 130 or the first electrode E1. The middle portion 131M may include an area between the upper area 131H and the lower area 131L.

According to an embodiment of the present disclosure, each of the upper area 131H, the middle area 131M, and the lower area 131L included in the groove 131 may have the different curved shapes. For example, a length of the curved surface (or a length of the inclined surface) of each of the upper area 131H, the middle area 131M, and the lower area 131L included in the groove 131 may be different from each other.

The groove 131 according to an embodiment of the present disclosure may have a maximum inclination at the periphery of the end lateral surface E1e of the first electrode E1. For example, the groove 131 may have a tangential inclination (or a tangent slope) at the upper area 131H close to the first electrode E1. For example, the upper area 131H of the groove 131 adjacent to the first electrode E1 may include an incline (or slope) having a maximum tangential inclination.

According to an embodiment of the present disclosure, the upper area 131H of the groove 131 may be a formation (or placement) area of the barrier layer BL. The upper area 131H of the groove 131 may include a maximum incline having a tangential inclination θ1 of 75° or more so as to form the barrier layer BL. For example, the maximum incline may have a tangential inclination θ1 of 75 degrees or more with respect to the upper surface 130a of the planarization layer 130.

According to an embodiment of the present disclosure, when the maximum incline provided at the upper area 131H of the groove 131 has the maximum tangential inclination θ1 less than 75°, the light emitting portion provided at the groove 131 is increased in its thickness, whereby an electrical short (or short circuit) between the first electrode E1 and the second electrode E2 is not generated at the end of the first electrode E1, and thus, it is impossible to form the barrier layer BL. Accordingly, in order to generate the electrical short between the first electrode E1 and the second electrode E2 at the end of the first electrode E1 and to form the barrier layer BL in the short area, the upper area 131H of the groove 131 may be configured to include the maximum incline having the tangential inclination θ1 of 75 degrees or more.

According to an embodiment of the present disclosure, the upper area 131H of the groove 131 may include the maximum incline having the tangential inclination of 75° or more which is disposed within an area (L1×D1) of a first distance L1 and a first depth D1 from the end lateral surface E1e of the first electrode E1. For example, with respect to the first direction X, the first distance L1 between the end lateral surface E1e of the first electrode E1 and the maximum incline may be 0.5 micrometer (μm) or less. For example, with respect to the thickness direction Z of the planarization layer 130, the first depth D1 between the end lateral surface E1e of the first electrode E1 and the maximum incline may be 0.8 micrometer or less. The first depth D1 may be larger than the first distance L1.

According to an embodiment of the present disclosure, with respect to the thickness direction Z of the planarization layer 130, a total height H1 of the groove 131 may be 2 micrometer or more. For example, the height H1 between the upper surface 130a of the planarization layer 130 and the bottom surface (BS) of the groove 131 may be 2 micrometer or more. For example, the first depth D1 may be ¼ of the total height H1 of the groove 131, but embodiments of the present disclosure are not limited thereto.

Figure 7:
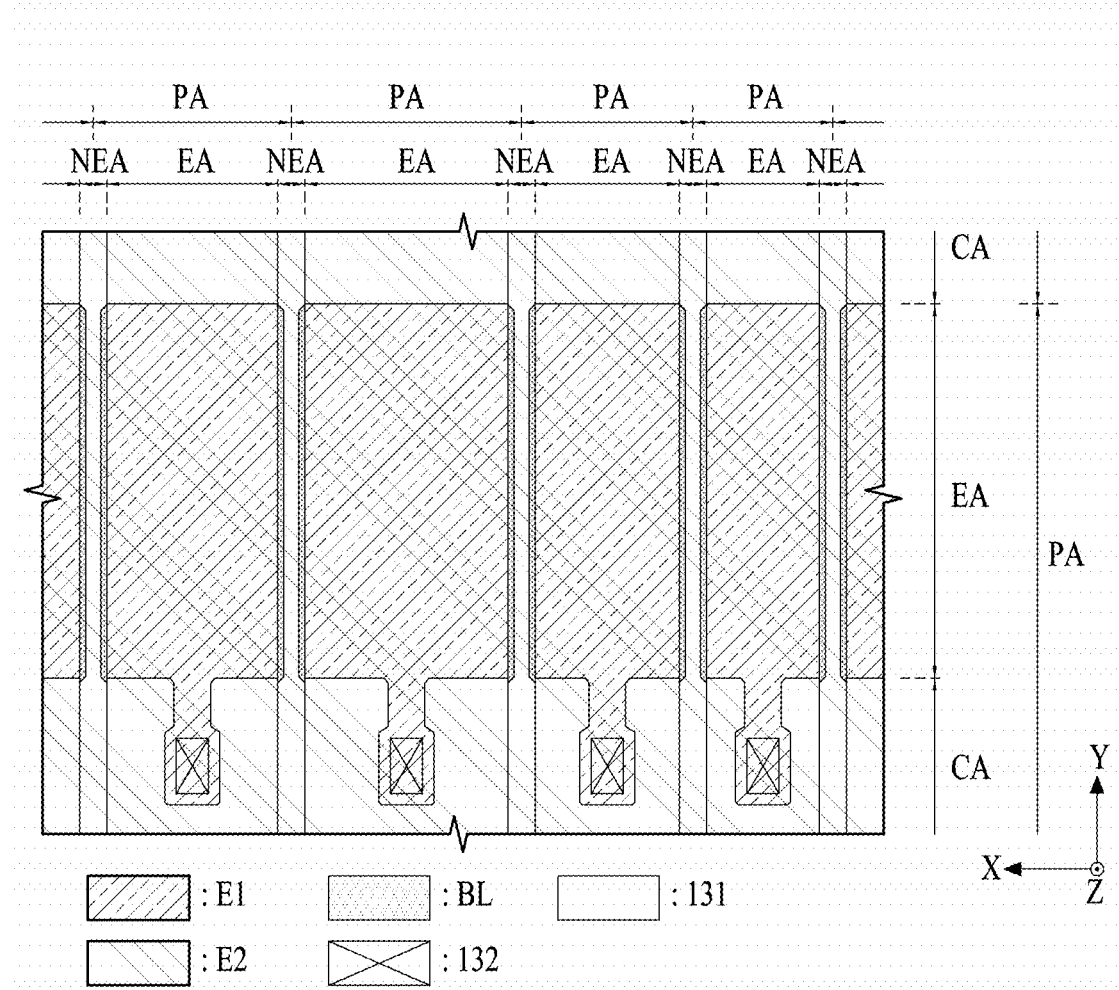
FIG. 7 is a plan view illustrating a barrier layer according to an embodiment of the present disclosure.

FIG. 7 is a plan view illustrating the barrier layer according to an embodiment of the present disclosure, which shows the barrier layer formed by the groove shown in FIGS. 5 and 6.

Referring to FIGS. 4 to 7, the barrier layer BL according to an embodiment of the present disclosure may be provided or disposed at the periphery of the end lateral surface E1e of the first electrode E1 disposed in each pixel area PA so as to be adjacent to the groove 131.

The barrier layer BL according to an embodiment of the present disclosure may be formed in a pattern shape above the groove 131 between each emission area EA of the pixel area PA. The barrier layer BL may be provided as a pattern shape at the periphery of one end and the other end of the first electrode E1 disposed in the emission area EA of each pixel area PA so as to be parallel to the second direction Y. For example, the barrier layer BL disposed at the periphery of one end of the first electrode E1 may have a shape (or morphology) corresponding to a shape of one end of the first electrode E1.

According to an embodiment of the present disclosure, the first electrode E1 disposed in each pixel PA may have a rectangular shape or a non-rectangular shape in accordance with a planar structure of each pixel area PA comprising one unit pixel. Accordingly, one end (or left side) of the first electrode E1 disposed in each pixel area PA may include at least one or more of a straight line portion, an inclined line portion, and a curved line portion. Thus, the barrier layer BL may include at least one or more of the straight line portion, the inclined line portion, and the curved line portion of the one end of the first electrode E1. As an embodiment, the barrier layer BL may include one straight line portion which is parallel to the second direction Y. As another embodiment, the barrier layer BL may include a plurality of straight line portions parallel to the second direction Y, and a plurality of inclined line portions (or oblique line portions) between the plurality of straight line portions.

Thus, the barrier layer BL according to an embodiment of the present disclosure is provided between the first electrode E1 and the second electrode E2 on the upper area of the groove 131 disposed at the end lateral surface E1e of the first electrode E1, whereby the barrier layer BL may be provided at between the emission areas EA of the adjacent pixel areas PA along the first direction X. Accordingly, the barrier layer BL may electrically separate or disconnect the self-light emitting portion EP in-between the emission areas EA of the adjacent pixel areas PA along the first direction X, to thereby prevent the lateral-surface leakage current LLC between the adjacent pixel areas PA along the first direction X.

Figure 8:
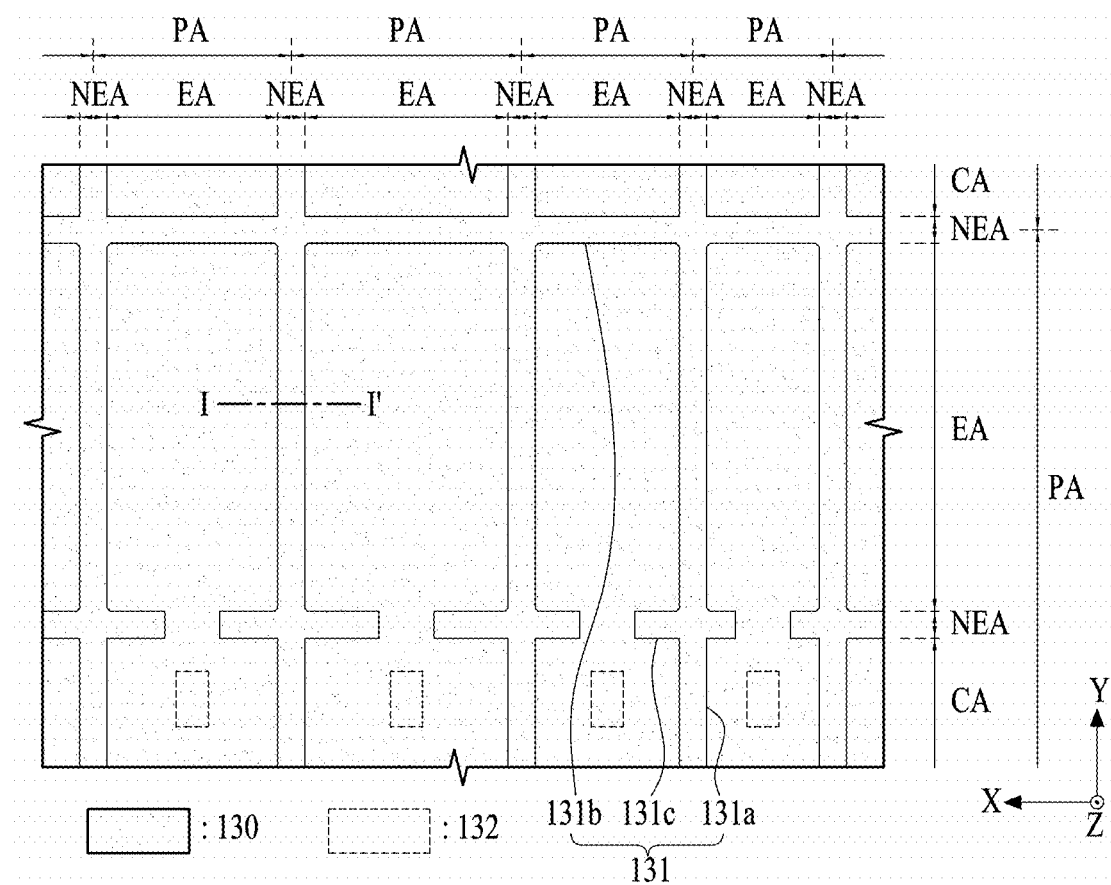
FIG. 8 is a plan view illustrating a groove according to another embodiment of the present disclosure.

FIG. 8 is a plan view illustrating a groove according to another embodiment of the present disclosure. A cross sectional view along I-I' of FIG. 8 is shown in FIG. 6.

Referring to FIG. 8 in connection with FIGS. 4 to 6, the groove 131 according to another embodiment of the present disclosure may be disposed or provided at the planarization layer 130 to surround each pixel area PA. Except a planar structure of the groove 131 according to another embodiment of the present disclosure, a cross-sectional structure of the groove 131 according to another embodiment of the present disclosure may substantially the same as the groove according to an embodiment of the present disclosure shown in FIG. 6, whereby a detailed description for the cross-sectional structure of the groove 131 will be omitted, and only the planar structure of the groove 131 will be described as follows.

The groove 131 according to another embodiment of the present disclosure may include a first groove 131a and a second groove 131b.

The first groove 131a may be concavely provided between the two adjacent pixel areas PA along the first direction X. For example, the first groove 131a may be concavely provided between the two adjacent pixel areas PA along the first direction X so as to have a first line shape (or vertical line shape) parallel to the second direction Y which is intersects or transverse to the first direction X. For example, the first groove 131a may be concavely formed from one side (or right side) of the first pixel area and the other side (or left side) of the second pixel area among the two adjacent pixel areas PA along the first direction X. The first groove 131a is disposed between the emission areas EA of the two adjacent pixel areas PA to each other along the first direction X, and thus, the first groove 131a may define the emission area EA of the adjacent pixel areas PA along the first direction X, or may implement the non-emission area NEA between the adjacent pixel areas PA along the first direction X. And, the first groove 131a is concavely provided at a predetermined depth D1, thereby preventing or minimizing a color mixture between the two adjacent pixel areas PA along the first direction X.

The second groove 131b may be concavely provided between the close two pixel areas PA along the second direction Y. For example, the second groove 131b may be concavely provided between the two adjacent pixel areas PA along the second direction Y so as to have a second line shape (or horizontal line shape) parallel to the first direction X. For example, the second groove 131b may be concavely formed from one side (or lower side) of the first pixel area and the other side (or upper side) of the second pixel area among the two adjacent pixel areas PA along the second direction Y. The second groove 131b is disposed between the one side emission areas EA of the first pixel area and the circuit area CA of the second pixel area among the two adjacent pixel areas PA to each other along the second direction Y, and thus, the second groove 131b may define the emission area EA of the adjacent pixel areas PA along the second direction Y, or may implement the non-emission area NEA between the adjacent pixel areas PA along the second direction Y. And, the second groove 131b is concavely provided at a predetermined depth D1, thereby preventing or minimizing a color mixture between the two adjacent pixel areas PA along the second direction Y.

Intersection areas of the first groove 131a and the second groove 131b may be coupled to each other or may be in communication with each other, whereby each pixel area PA may be surrounded by the first groove 131a and the second groove 131b.

The groove 131 according to another embodiment of the present disclosure may include a third groove 131c.

The third groove 131c may be concavely provided in each pixel area PA to be parallel to the first direction X or to be parallel the second groove 131b. For example, the third groove 131c may be concavely provided between the emission area EA and the circuit area CA so as to have a third line shape (or dotted horizontal line shape) parallel to the first direction X inside each pixel area PA. For example, the third groove 131c may be concavely provided from one side (or lower side) of the emission area EA and the other side (or upper side) of the circuit area CA inside each pixel area PA.

The third groove 131c may be provided at the remaining portions except an area corresponding to forming area of an electrode contact hole 132 among the area between the emission area EA and the circuit area CA inside each pixel area PA. For example, the third groove 131c may be not provided (or not formed) at the area where one end of the first electrode disposed at the emission area EA of each pixel area PA is provided. Accordingly, the third groove 131c may be provided or disposed only at the intersection area with the first groove 131a and a peripheral area thereof. For example, the third groove 131c may have a shape which extends or protrudes from the first groove 131a toward the area between the emission area EA and the circuit area CA inside each pixel area PA along the first direction X. The third groove 131c extending from the first groove 131a along the first direction X may be spaced apart from each other in-between the emission area EA and the circuit area CA in each pixel area PA. And, the intersection areas of the first groove 131a and the third groove 131c may be coupled to each other or may be in communication with each other.

Figure 9:
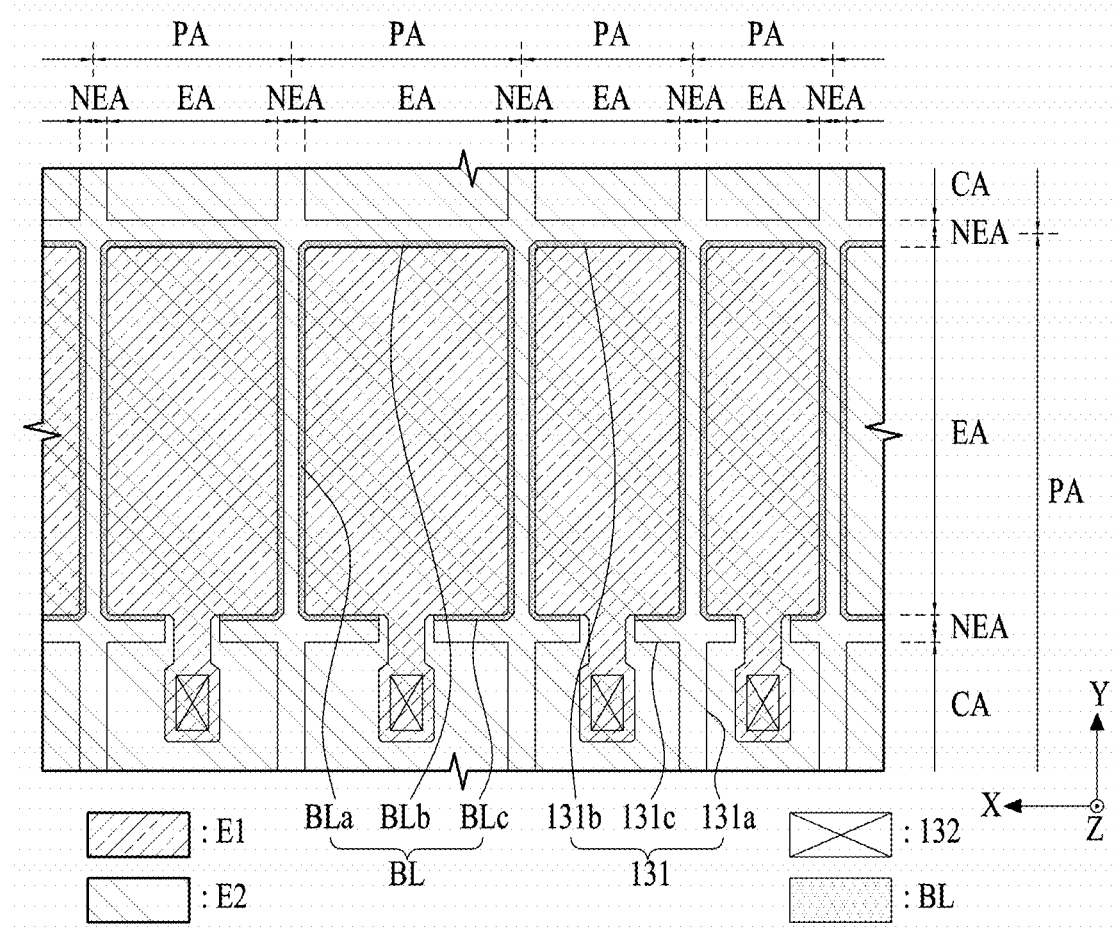
FIG. 9 is a plan view illustrating a groove according to another embodiment of the present disclosure.

FIG. 9 is a plan view illustrating a barrier layer according to another embodiment of the present disclosure, which shows the barrier layer formed by the groove shown in FIG. 8.

Referring to FIG. 9 in connection with FIGS. 6 to 8, the barrier layer BL according to another embodiment of the present disclosure may be provided or disposed at the periphery of the end lateral surface E1e of the first electrode E1 disposed in each pixel area PA so as to be adjacent to the groove 131.

The barrier layer BL according to another embodiment of the present disclosure may be formed in a pattern shape above the groove 131 between each emission area EA of the pixel area PA. The barrier layer BL may have a shape (or morphology) corresponding to a shape of the remaining portions except the extending portion of the first electrode E1. For example, the barrier layer BL may be formed in a pattern shape configured to surround the remaining portions except the extending portion of the first electrode E1 disposed between the emission area EA and the circuit area CA in each pixel area PA. For example, the barrier layer BL may include a planar structure of a rectangular shape or a non-rectangular shape having an opening corresponding to the extending portion of the first electrode E1.

The barrier layer BL according to another embodiment of the present disclosure may be provided at the periphery of the end of the first electrode E1 surrounded by the first to third grooves 131a, 131b, 131c of the groove 131. For example, the barrier layer BL may include a first barrier pattern BLa and a second barrier pattern BLb.

The first barrier pattern BLa may be provided in a pattern shape above the first groove 131a between the emission areas EA of the adjacent pixel areas PA along the first direction X. The first barrier pattern BLa may be provided as a pattern shape above the periphery of one end and the other end of the first electrode E1 disposed at the emission area EA of each pixel area PA so as to be parallel to the second direction Y. For example, the first barrier pattern BLa may have a shape corresponding to a shape of each of one end and the other end of the first electrode E1.

The second barrier pattern BLb may be provided in a pattern shape above the second groove 131b between the adjacent pixel areas PA along the second direction Y. The second barrier pattern BLb may be provided as a pattern shape on the periphery of one side (or upper side) of the first electrode E1 disposed at the emission area EA of each pixel area PA so as to be parallel to the second direction Y. For example, the second barrier pattern BLb may have a shape corresponding to a shape of one side (or upper side) of the first electrode E1. For example, the second barrier pattern BLb is disposed in-between each of the first barrier patterns BLa, and may be coupled to one side (or upper side) of the first barrier pattern BLa. Thus, the first barrier pattern BLa and the second barrier pattern BLb may be coupled to each other, and thus, barrier layer BL may include a planar structure of a rectangular shape or a non-rectangular shape having a lower opening in plan view.

The barrier layer BL according to another embodiment of the present disclosure may further include a third barrier pattern BLc.

The third barrier pattern BLc may be provided in a pattern shape above the third groove 131c between the emission area EA and the circuit area CA in each pixel area PA along the second direction Y. The third barrier pattern BLc may be provided as a pattern shape above the periphery of the other side (or lower side) of the first electrode E1 disposed at the emission area EA of each pixel area PA so as to be parallel to the second direction Y. For example, the third barrier pattern BLc may have a shape corresponding to a shape of the remaining portions except the extending portion from the other side (or lower side) of the first electrode E1. For example, the third barrier pattern BLc is disposed in-between each of the first barrier patterns BLa, and may be coupled to the other side (or lower side) of the first barrier pattern BLa. Thus, the first to third barrier patterns (BLa, BLb, BLc) may be coupled to one another, and thus, the barrier layer BL may include a planar structure of a rectangular shape or a non-rectangular shape having a lower opening corresponding to the extending portion of the first electrode E1 in plan view.

Each of the first and second barrier patterns BLa and BLb or each of the first to third barrier patterns BLa, BLb, and BLc may include at least one or more of a straight line portion, an inclined line portion, or a curved line portion in accordance with the planar structure of the first electrode E1. As an embodiment, each of the first and second barrier patterns BLa and BLb or each of the first to third barrier patterns BLa, BLb, and BLc may include one straight line portion. As another embodiment, each of the first and second barrier patterns BLa and BLb or each of the first to third barrier patterns BLa, BLb, and BLc may include a plurality of straight line portions parallel to any one of the first direction X and the second direction Y, and a plurality of inclined line portions (or oblique line portions) between the plurality of straight line portions.

Therefore, the barrier layer BL according to another embodiment of the present disclosure is provided between the first electrode E1 and the second electrode E2 on the upper area of the groove 131 disposed at the periphery of the end lateral surface E1e of the remaining portions except the extending portion of the first electrode E1, whereby the barrier layer BL may be configured to surround the remaining portions except a portion of the emission area EA in each pixel area PA. Thus, the barrier layer BL may electrically separate or disconnect the self-light emitting portion EP in all the remaining portions except the extending portion of the first electrode E1 in the emission area EA of each pixel area PA, to thereby prevent the lateral-surface leakage current LLC in all the remaining portions except the extending portion of the first electrode E1 of each pixel area PA.

Figure 10:
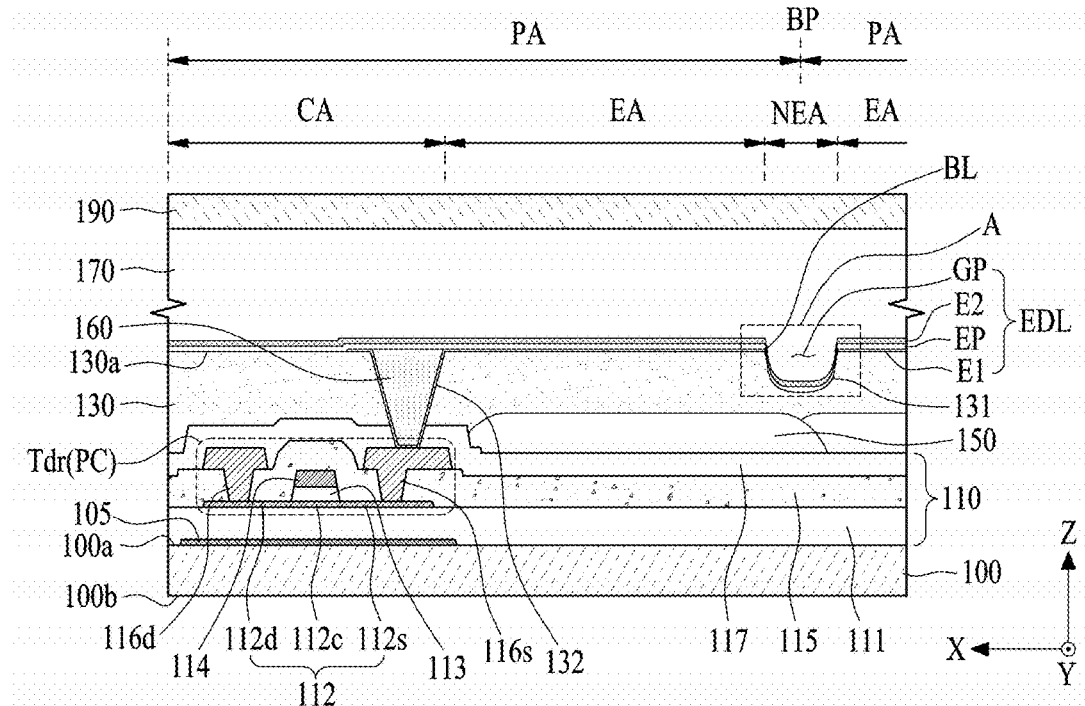
FIG. 10 is a cross sectional view illustrating a cross-sectional structure of a pixel according to another embodiment of the present disclosure.

FIG. 10 is a cross sectional view illustrating a cross-sectional structure of a pixel according to another embodiment of the present disclosure and illustrates an embodiment where a bank layer is additionally provided in the light emitting display panel (or light emitting display apparatus) illustrated in FIGS. 3 to 9. Therefore, in the following description, descriptions of elements other than a bank layer and elements relevant thereto are replaced with the description of FIGS. 3 to 9. An expanded view of 'A' shown in FIG. 10 is illustrated in FIG. 4.

Referring to FIG. 10, a display panel 10 (or light emitting display apparatus) according to another embodiment of the present disclosure may further include a bank layer 160 disposed at a circuit area CA of each pixel area PA.

The bank layer (or bank pattern) 160 prevents an abnormal light emission which occurs in the circuit area CA, or may prevent an electrical short between a first electrode E1 and a second electrode E2 which occurs in an electrode contact hole 132 of the circuit area CA.

The bank layer 160 according to an embodiment of the present disclosure may be disposed above the electrode contact hole 132 of the circuit area CA. The bank layer 160 may be disposed above an extending portion of a first electrode E1 which is electrically coupled to a driving thin film transistor Tdr via the electrode contact hole 132. For example, the bank layer 160 may be disposed between a self-light emitting portion EP and the first electrode E1 overlapped with the electrode contact hole 132. For example, the bank layer 160 may be filled in the electrode contact hole 132 so as to overlay (or cover) the extending portion of the first electrode E1 disposed in the electrode contact hole 132, or the electrode contact hole 132 may be buried by the bank layer 160. For example, the bank layer 160 may form a planar surface above the extending portion of the first electrode E1 disposed in the electrode contact hole 132 of the circuit area CA.

The bank layer 160 according to an embodiment of the present disclosure may be provided only above the electrode contact hole 132 by a process configured to form a bank material overlaying (or covering) the entire portions of the first electrode E1 and a planarization layer 130 and a bank patterning process configured to remove the bank material from the remaining portion except an overlap portion with the electrode contact hole 132. For example, the bank material for overlaying (or covering) a groove 131 of the planarization layer 130 may remain without being removed by the bank patterning process, whereby a portion or entire portions of the groove 131 may be overlaid (or covered) with the bank layer 160. However, when the bank layer 160 is disposed at a portion or entire portions of the groove 131, the second electrode E2 is disposed in a planar structure above the bank layer 160 configured to overlay (or cover) the groove 131. Thus, as described above, it is impossible to prevent a color mixture between two adjacent emission areas through the second electrode E2 on the groove 131. In order to minimize or prevent a color mixture between two adjacent emission areas through the second electrode E2 on the groove 131, the bank material overlaying (or covering) the groove 131 of the planarization layer 130 is preferably removed by the bank patterning process.

Additionally, the bank layer 160 may be provided to overlay (or cover) the circuit area CA of each pixel area PA. As an embodiment, the bank layer 160 may be configured to overlay (or cover) all the extending portion of the first electrode E1 disposed in the circuit area CA of each pixel area PA. As another embodiment, the bank layer 160 may be configured to overlay (or cover) all the entire circuit area CA of each pixel area PA. For example, the bank layer 160 may be formed in a line shape parallel to the first direction X so as to overlay (or cover) the entire remaining circuit area CA except a non-emission area NEA overlapped with the groove 131 and the emission area of each pixel area PA.

The bank layer 160 according to an embodiment of the present disclosure may be formed of an organic material, for example, benzocyclobutene (BCB)-based resin, acryl-based resin, or polyimide resin. For example, the bank layer 160 may be formed of a photosensitizer containing a black pigment. In this case, the bank layer 160 may function as a light shielding member between the adjacent pixels.

Except for that the self-light emitting portion EP is disposed above the first electrode E1 and the bank layer 160, the self-light emitting portion EP may substantially the same as or similar to the self-light emitting portion EP described above with reference to FIGS. 3 to 9, and their repetitive descriptions are omitted or will be briefly given.

Except for that the second electrode E2 is disposed above the self-light emitting portion EP, the second electrode E2 may substantially the same as or similar to the second electrode E2 described above with reference to FIGS. 3 to 9, and their repetitive descriptions are omitted or will be briefly given.

Accordingly, the display panel 10 (or light emitting display apparatus) according to another embodiment of the present disclosure may have the same effects as those of the display panel 10 (or light emitting display apparatus) explained in FIGS. 3 to 9, and the display panel 10 (or light emitting display apparatus) according to another embodiment of the present disclosure may prevent an abnormal light emission which occurs in the circuit area CA by the use of bank layer 160, or may prevent an electrical short between the first electrode E1 and the second electrode E2 which occurs in the electrode contact hole 132 of the circuit area CA.

Figure 11:
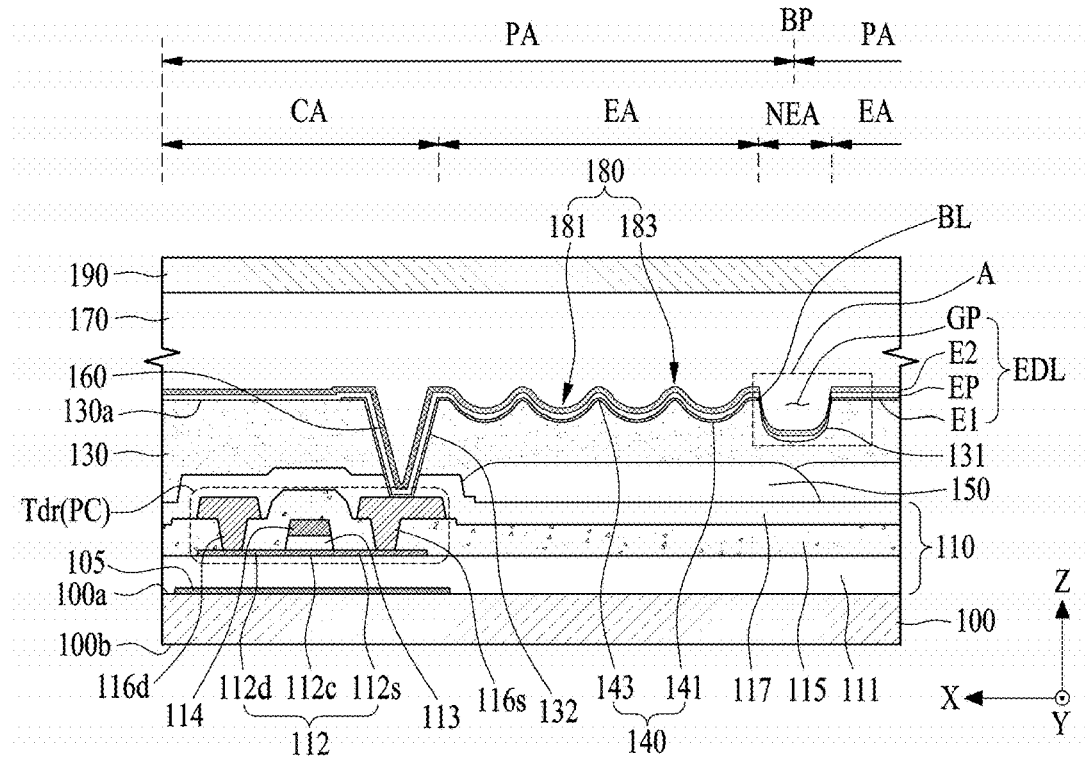
FIG. 11 is a cross sectional view illustrating a cross-sectional structure of a pixel according to another embodiment of the present disclosure.
Figure 12:
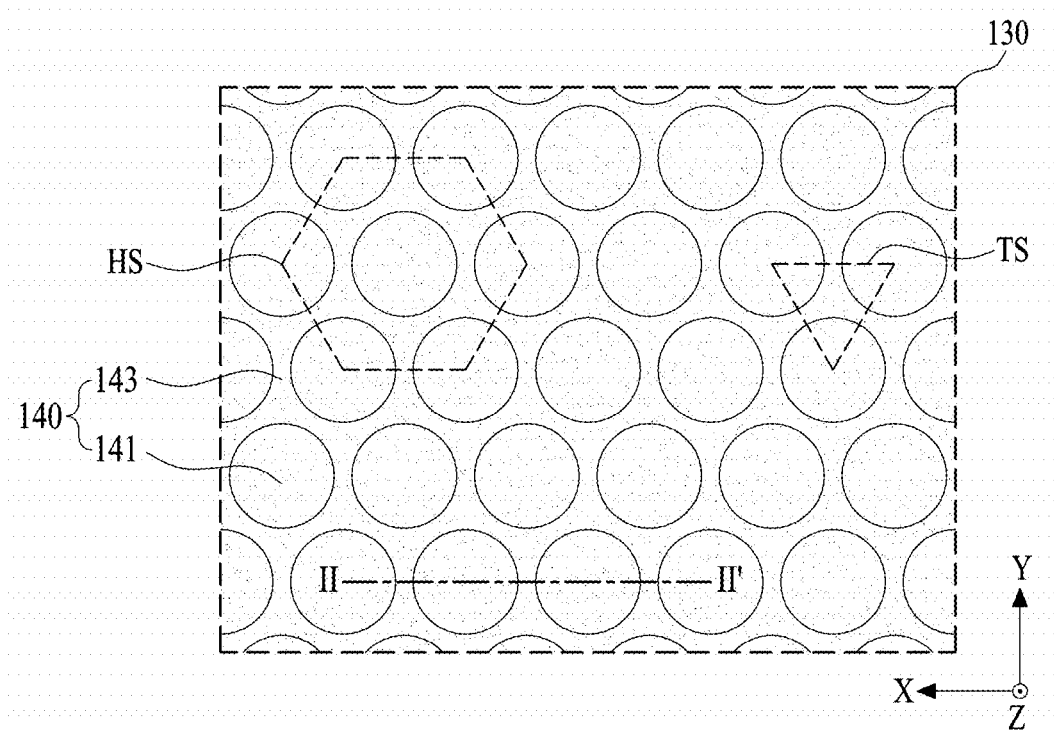
FIG. 12 is a plan view illustrating a planar structure of a light extraction pattern shown in FIG. 11.
Figure 13:
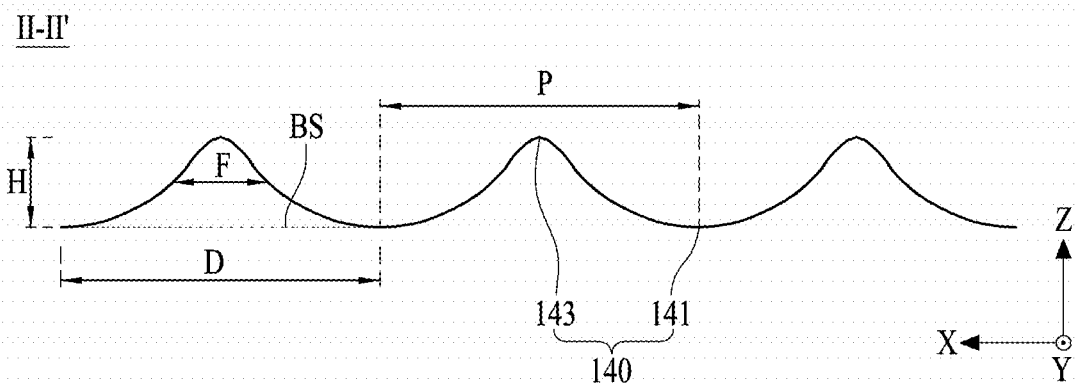
FIG. 13 is a cross sectional view along II-II' of FIG. 12.

FIG. 11 is a cross sectional view illustrating a cross-sectional structure of a pixel according to another embodiment of the present disclosure, FIG. 12 is a plan view illustrating a planar structure of a light extraction pattern shown in FIG. 11, and FIG. 13 is a cross sectional view along II-IP of FIG. 12. FIGS. 11 to 13 illustrate an embodiment where a light extraction pattern is additionally provided in the light emitting display panel (or light emitting display apparatus) illustrated in FIGS. 3 to 9. Therefore, in the following description, descriptions of elements other than a light extraction pattern and elements relevant thereto are replaced with the description of FIGS. 3 to 9. An expanded view of 'A' shown in FIG. 11 is illustrated in FIG. 4.

Referring to FIGS. 11 to 13, a display panel 10 (or light emitting display apparatus) according to another embodiment of the present disclosure may further include a light extraction pattern 140 disposed at an emission area EA of each pixel area PA.

A planarization layer 130 may include the light extraction pattern 140 disposed in the pixel area PA. For example, the planarization layer 130 may include the light extraction pattern 140 disposed at the emission area EA of the pixel area PA.

The light extraction pattern 140 may be provided at an upper surface 130a of the planarization layer 130 to be overlapped with the emission area EA of the pixel area PA. The light extraction pattern 140 is provided at the planarization layer 130 of the emission area EA and is configured to have a curved (or uneven) shape whereby a progress path of light emitted from the self-light emitting portion EP is changed to increase light extraction efficiency of the pixel. For example, the light extraction pattern 140 may be referred to as an uneven pattern portion, a microlens, a light scattering pattern, a fine structure, a light path controller, a microlens portion, or a microlens array portion, but embodiments of the present disclosure are not limited thereto.

The light extraction pattern 140 according to an embodiment of the present disclosure may be disposed at the planarization layer 130 overlapped with the emission area EA of at least one or more among the plurality of pixel areas PA configuring one unit pixel.

As an embodiment, the light extraction pattern 140 may be disposed at the planarization layer 130 overlapped with an emission area EA of a green pixel and/or a blue pixel included in one unit pixel in accordance with a light emission efficiency, an external light extraction efficiency, and a luminance in each of the plurality of pixels configuring one unit pixel, but embodiments of the present disclosure are not limited thereto. As another embodiment, the light extraction pattern 140 may be disposed at the planarization layer 130 overlapped with an emission area EA of a white pixel among the plurality of pixels configuring one unit pixel, or may be disposed at the planarization layer 130 overlapped with an emission area EA of at least one or more among a green pixel, a blue pixel, and a white pixel included in one unit pixel, but embodiments of the present disclosure are not limited thereto.

The light extraction pattern 140 according to an embodiment of the present disclosure may include a plurality of concave portions 141 and a protruding portion 143 disposed between the plurality of concave portions 141.

Each of the plurality of concave portions 141 may be concavely provided from the upper surface 130a of the planarization layer 130. The plurality of concave portions 141 may have the same depth with respect to the upper surface 130a of the planarization layer 130. However, some of the plurality of concave portions 141 may have the different depths due to an error or tolerance range for a patterning process of the light extraction pattern 140

The depth of each of the plurality of concave portions 141 may be 2 micrometer or less with respect to a thickness direction Z of the planarization layer 130. For example, a height between the upper surface 130a of the planarization layer 130 and a bottom surface of the engraved portion 141 may be 2 micrometer or less. For example, at least one or more among the plurality of concave portions 141 may have a smaller size in comparison to the groove 131.

The plurality of concave portions 141 may respectively be arranged in parallel in a zigzag shape along the second direction Y while being spaced apart from each other along the first direction X. For example, the plurality of concave portions 141 are arranged in a lattice shape having a constant interval, and the concave portions 141 adjacent to each other may be disposed alternately along the second direction Y. Three adjacent concave portions 141 may be disposed in two-dimensionally triangular shape, and line segments among centers of three adjacent concave portions 141 may configure two-dimensionally triangular shape TS. Also, the plurality of concave portions 141 may respectively be surrounded by six concave portions 141 disposed around them. In this case, six concave portions 141 disposed to surround one concave portion 141 may be disposed in two-dimensionally hexagonal shape HS, and line segments among centers of six concave portions 141 disposed to surround one concave portion 141 may configure two-dimensionally hexagonal shape HS. For example, the protruding portion 143 and the plurality of concave portions 141 may be disposed or arranged in two-dimensionally honeycomb shape or a hexagonal shape.

A pitch (or interval) between the concave portions 141 arranged in the plurality of pixels P configuring one unit pixel may be the same or different from each other. Herein, the pitch between the concave portions 141 may be a distance (or interval) between central points of the two adjacent concave portions 141.

As an embodiment, a pitch P between each of the concave portions 141 disposed at the red pixel, the green pixel, and the blue pixel configuring one unit pixel may be the same or different from each other. For example, a pitch P between the concave portions 141 disposed at the green pixel may be different from a pitch P between the concave portions 141 disposed at the blue pixel.

As another embodiment, a pitch P between each of the concave portions 141 disposed at the red pixel, the green pixel, the blue pixel, and the white pixel configuring one unit pixel may be the same or different from each other. For example, a pitch P between each of the concave portions 141 disposed at the white pixel and/or the green pixel may be different from a pitch P between each of the concave portions 141 disposed at the red pixel and/or the blue pixel.

The protruding portion 143 may be configured to individually surround each of the plurality of concave portions 141. For example, the planarization layer 130 overlapped with the emission area EA may include the plurality of concave portions 141 surrounded by the protruding portion 143. The protruding portion 143 surrounding one concave portion 141 may have a hexagonal shape (or honeycomb shape) in plan view. The protruding portion 143 may change a progress path of light emitted from the self-light emitting portion EP toward the substrate 100, to thereby enhance an external extraction efficiency of the light emitted from the self-light emitting portion EP.

The protruding portion 143 according to an embodiment of the present disclosure may be convexly provided to have a first diameter and a first height. The protruding portion 143 may include a bottom portion (or bottom surface) in each of the plurality of concave portions 141, and an inclined surface inclined in all directions from the bottom portion. For example, the protruding portion 143 may have a cross-sectional structure of Gaussian curve or may have a sharp cross-sectional structure at the top portion. For example, the top portion of the protruding portion 143 may have a sharp tip.

An emission efficiency of a light emitting portion may be determined depending on a shape of the protruding portion 143. A light extraction efficiency may be determined depending on a shape of the protruding portion 143 of the light extraction pattern 140 and a shape of the self-light emitting portion EP.

A shape of the protruding portion 143 may be a variable capable of determining a light emission efficiency, a light extraction efficiency, and a current efficiency enhancement of the light emitting display apparatus. Examples of the parameter for determining a shape of the protruding portion 143 may include a diameter D of the protruding portion 143, a height H of the protruding portion 143, a full-width at half max F, an aspect ratio AR, a half-height aspect ratio F_AR, a 4/5 height aspect ratio F'_AR, a half-height sharpness Rm, and a tangential inclination.

The aspect ratio AR of the protruding portion 143 refers to a ratio of the height H to a radius D/2 of the protruding portion 143 and may be defined with a value H/(D/2) obtained by dividing the height H by the radius D/2 of the bottom side (or bottom surface) BS. For example, the protruding portion 143 may have the aspect ratio AR of 0.35 0.65.

The half-height aspect ratio F_AR of the protruding portion 143 refers to a ratio of the height H to a half-height width (Full Width Half Max) F of the protruding portion 143 and may be defined as a value (H/2)/(F/2) obtained by dividing the half height H/2 by a radius F/2 at the half-height H/2 position, or may be defined as a value H/F obtained by dividing the height H by the half-height width F. Herein, the half-height width F may include a width of a bottom side at a point corresponding to the half H/2 position with respect to the height H. For example, the protruding portion 143 may have the half-height aspect ratio F_AR of 0.4~0.7.

The 4/5 height aspect ratio F'_AR is an aspect ratio to a width F' at a 4/5 height 4H/5 position, refers to a ratio of the 4/5 height 4H/5 to a half width F'/2 at the 4/5 height 4H/5 position. This may be defined with a value (4H/5)/(F'/2) obtained by dividing the 4/5 height 4H/5 by the half width F'/2 at the 4/5 height 4H/5 position. Herein, the width F' at the 4/5 height of the protruding portion 143 is defined as a width of a bottom side at the 4/5 height 4H/5 position (or 80% point) of the total height H of the protruding portion 143 with respect to the bottom surface of the protruding portion 143. For example, the protruding portion 143 may have the 4/5 height aspect ratio F'_AR of 0.4~0.65.

The half-height sharpness Rm of the protruding portion 143 refers to a ratio of the half-height aspect ratio F_AR to the aspect ratio AR and may be defined with a value F_AR/AR obtained by dividing the half-height aspect ratio F_AR by the aspect ratio AR. For example, the protruding portion 143 may have the half-height sharpness Rm of 1.1~1.3.

The protruding portion 143 may have a tangential inclination which is gradually decreased from the top portion to the bottom surface BS. For example, the tangential inclination may be defined by an angle between the curved-surface portion and a horizontal line parallel to the bottom surface BS of the protruding portion 143.

The protruding portion 143 may have a maximum tangential inclination between the half height H/2 and the top portion. For example, the protruding portion 143 may include a first tangential inclination at the half height H/2, and a second tangential inclination at the 4/5 height. The second tangential inclination may be greater than the first tangential inclination so that light emitted from the self-light emitting portion EP is externally extracted at maximum without being trapped within the light emitting device layer EDL.

The light extraction pattern 140 including the plurality of concave portions 141 and the protruding portion 143 may be formed through an etching process of the planarization layer 130 using a mask pattern after the mask pattern is formed over the planarization layer 170 of the light emission portion EP through a photolithography process using a photoresist. For example, a positive photoresist may be used as the photoresist to improve productivity.

The light emitting device layer EDL is disposed above the light extraction pattern 140 of the emission area EA, and the light emitting device layer EDL may emit the light toward the substrate 100 according to a bottom emission type, but embodiments of the present disclosure are not limited thereto. The light emitting device layer EDL according to an embodiment of the present disclosure may include a first electrode E1, the self-light emitting portion EP, and a second electrode E2.

Except for a cross-sectional shape (or structure) above the light extraction pattern 140 of the planarization layer 130, the first electrode E1 may substantially the same as or similar to the first electrode E1 described above with reference to FIGS. 3 to 9, and their repetitive descriptions are omitted or will be briefly given.

The first electrode E1 is provided (or deposited) above the planarization layer 130 to have a relatively small thickness, and thus, the first electrode E1 may have a surface morphology (or second surface shape) corresponding to a surface morphology (or first surface shape) of the light extraction pattern 140 including the protruding portion 143 and the plurality of concave portions 141. For example, the first electrode E1 is formed in a conformal shape based on the surface shape (morphology) of the light extraction pattern 140 by a deposition process of a transparent conductive material, whereby the first electrode E1 may have a cross-sectional structure whose shape is the same as that of the light extraction pattern 140.

Except for that the first electrode E1 is disposed at the light extraction pattern 140 of the planarization layer 130, the first electrode E1 may substantially the same as or similar to the first electrode E1 described above with reference to FIGS. 3 to 9, and their repetitive descriptions are omitted or will be briefly given.

Except for the cross-sectional shape (or structure) on the light extraction pattern 140 of the planarization layer 130, the self-light emitting portion EP may substantially the same as or similar to the self-light emitting portion EP described above with reference to FIGS. 3 to 9, and their repetitive descriptions are omitted or will be briefly given.

The self-light emitting portion EP is provided above the first electrode E1 and may directly contact the first electrode E1. The light emitting device layer EDL is provided (or deposited) above the first electrode E1 to have a relatively large thickness in comparison to the first electrode E1, and thus, the light emitting device layer EDL may have a surface morphology (or third surface shape) which is different from the surface morphology in each of the protruding portion 143 and the plurality of concave portions 141 or the surface morphology of the first electrode E1. For example, the light emitting device layer EDL may be formed in a non-conformal shape which does not conform to the surface shape (or morphology) of the first electrode E1 by a deposition process, whereby the light emitting device layer EDL may have a cross-sectional structure whose shape is different from that of the first electrode E1.

The self-light emitting portion EP according to an embodiment of the present disclosure may be embodied to have a gradually-increased thickness toward the bottom surface of the engraved portion 141 or the protruding portion 143. For example, the self-light emitting portion EP may be embodied to have a first thickness at the top of the protruding portion 143, and a second thickness at the bottom surface of the concave portion 141, wherein the second thickness is relatively larger than the first thickness, and a third thickness on the inclined surface (or curved surface portion) of the protruding portion 143, wherein the third thickness is relatively smaller than the first thickness. Herein, each of the first, second, and third thicknesses may be the shortest distance between the first electrode E1 and the second electrode E2.

Except for the cross-sectional shape (or structure) on the light extraction pattern 140 of the planarization layer 130, the second electrode E2 may substantially the same as or similar to the second electrode E2 described above with reference to FIGS. 3 to 9, and their repetitive descriptions are omitted or will be briefly given.

The second electrode E2 is provided above the self-light emitting portion EP and may directly contact the self-light emitting portion EP. The second electrode E2 may have a surface morphology corresponding to a surface morphology of the self-light emitting portion EP. For example, the second electrode E2 may be formed in a conformal shape corresponding to the surface shape (or morphology) of the self-light emitting portion EP by a deposition process, whereby the second electrode E2 may have a cross-sectional structure whose shape is the same as that of the self-light emitting portion EP.

The light emitting device layer EDL disposed in the emission area EA of each pixel area PA is provided above the light extraction pattern 140, and thus, the light emitting device layer EDL may include a non-planar portion 180.

The non-planar portion 180 may include a plurality of concave regions 181, and a protruding region 183 between the plurality of concave regions 181.

Each of the plurality of concave regions 181 may be overlapped with each of the plurality of concave portions 141 included in the light extraction pattern 140. For example, according as the self-light emitting portion EP is formed at a second thickness on a portion of a bottom surface in each of the plurality of concave regions 181, the portion of the bottom surface in each of the plurality of concave regions 181 may be a non-emission area or a non-effective emission area.

The protruding region 183 may be overlapped with the protruding portion 143 of the light extraction pattern 140. For example, according as a top portion of the protruding region 183 is formed at a first thickness, the top portion of the protruding region 183 may be an effective emission area. For example, according as the self-light emitting portion EP is formed at a third thickness on an inclined surface (or curved surface portion) between the top portion of the protruding region 183 and the concave regions 181, the inclined surface between the top portion of the protruding region 183 and the concave region 181 may be a main emission area or an effective emission area.

The light generated in the self-light emitting portion EP of the light emitting device layer EDL may be changed toward the substrate 100 by the non-planar portion 180 having the plurality of concave regions 181 and the protruding region 183, to thereby enhance an external extraction efficiency of the light emitted from the self-light emitting portion EP.

Accordingly, the display panel 10 (or light emitting display apparatus) according to another embodiment of the present disclosure may have the same effects as those of the display panel 10 (or light emitting display apparatus) explained in FIGS. 3 to 9, and the display panel 10 (or light emitting display apparatus) according to another embodiment of the present disclosure may improve or maximize the external extraction efficiency of the light generated in each pixel area by the use of light extraction pattern 140.

Additionally, the display panel 10 (or light emitting display apparatus) according to another embodiment of the present disclosure may further include the bank layer 160 described above with reference to FIG. 10. In this case, the display panel 10 (or light emitting display apparatus) according to another embodiment of the present disclosure may prevent an abnormal light emission which occurs in the circuit area CA by the use of bank layer 160, or may prevent an electrical short between the first electrode E1 and the second electrode E2 which occurs in the electrode contact hole 132 of the circuit area CA.

The light emitting display apparatus according to the present disclosure may be explained as follows.

According to the embodiments of the present disclosure, the light emitting display apparatus may include a pixel area disposed at the substrate and configured to have an emission area and a non-emission area, a planarization layer disposed at the substrate, and a light emitting device layer disposed at the emission area and the non-emission area at the planarization layer, the light emitting device layer may include a barrier layer disposed at the boundary area between the emission area and the non-emission area.

According to the embodiments of the present disclosure, the light emitting device layer may include a first electrode, a self-light emitting portion at the first electrode, and a second electrode at the self-light emitting portion, the barrier layer may be disposed between the first electrode and the second electrode at the boundary area.

According to the embodiments of the present disclosure, the light emitting device layer may include a groove portion disposed in the non-emission area, the barrier layer may be disposed at the periphery of one end of the first electrode adjacent to the groove portion.

According to the embodiments of the present disclosure, a light emitting display apparatus may include a pixel area disposed at the substrate and configured to have an emission area and a non-emission area, a planarization layer disposed at the substrate, and a light emitting device layer disposed at the pixel area at the planarization layer, the light emitting device layer may include a first electrode, a self-light emitting portion at the first electrode, a second electrode at the self-light emitting portion, and a barrier layer disposed at the periphery of the shortest distance between the first electrode and the second electrode.

According to the embodiments of the present disclosure, the light emitting device layer may include a groove portion disposed in the non-emission area, the barrier layer may be disposed at the periphery of the shortest distance between the first electrode and the second electrode overlapped with the groove portion.

According to the embodiments of the present disclosure, the barrier layer may be formed of a non-conductive metal oxide based on the second electrode, or may be configured to disconnect the self-light emitting portion at the boundary area between the emission area and the non-emission area.

According to the embodiments of the present disclosure, the light emitting display apparatus may further include a groove concavely provided from the planarization layer of the non-emission area, the first electrode may be disposed at the remaining portions of the planarization layer except the groove, and the self-light emitting portion may be disposed at the first electrode and the groove.

According to the embodiments of the present disclosure, the barrier layer may be disposed between the second electrode and an end of the first electrode adjacent to the groove.

According to the embodiments of the present disclosure, the groove includes an upper area having an incline which is inclined from the upper surface of the planarization layer, wherein the incline has a tangential inclination of 75° or more with respect to the upper surface of the planarization layer.

According to the embodiments of the present disclosure, the groove may include an incline which is inclined from the upper surface of the planarization layer, and the incline may have a maximum tangential inclination within an area of a first distance and a first depth from the end of the first electrode.

According to the embodiments of the present disclosure, the first distance may be 0.5 micrometer or less, and the first depth may be 0.8 micrometer or less.

According to the embodiments of the present disclosure, the groove may be disposed in the non-emission area between the emission areas of adjacent pixel areas along a first direction, and the barrier layer may be disposed at the periphery of each of one end and the other end of the first electrode adjacent to the groove.

According to the embodiments of the present disclosure, the light emitting display apparatus may further include a driving thin film transistor disposed in a circuit area of the pixel area, the planarization layer may be disposed above the driving thin film transistor, and the first electrode may include an extending portion coupled to the driving thin film transistor via an electrode contact hole provided at the planarization layer.

According to the embodiments of the present disclosure, the light emitting display apparatus may further include at least one or more of a bank layer disposed above the electrode contact hole and a wavelength conversion layer overlapped with the emission area.

According to the embodiments of the present disclosure, the groove may be disposed to surround the remaining portions of the first electrode except the extending portion of the first electrode, and the barrier layer may be disposed to surround the remaining portions of the first electrode except the extending portion of the first electrode.

According to the embodiments of the present disclosure, the light emitting display apparatus may further include a light extraction pattern disposed at the planarization layer of the emission area, the light extraction pattern may include a plurality of concave portions, and a protruding portion between the plurality of concave portions.

According to the embodiments of the present disclosure, the concave portions may be arranged along the first direction while being parallel with each other, arranged in a zigzag shape along a second direction perpendicular to the first direction, or arranged in a honeycomb structure.

According to the embodiments of the present disclosure, the barrier layer may be formed of a non-conductive metal oxide, or may be configured to disconnect the self-light emitting portion on the boundary area between the emission area and the non-emission area.

According to the embodiments of the present disclosure, the light emitting display apparatus may further include a groove concavely provided from the planarization layer of the non-emission area, the first electrode may be disposed at the remaining portions of the planarization layer except the groove, and the self-light emitting portion may be disposed at the first electrode and the groove.

According to the embodiments of the present disclosure, the barrier layer may be disposed at the periphery of the shortest distance between the first electrode and the second electrode adjacent to the groove.

According to the embodiments of the present disclosure, the light emitting display apparatus may include a pixel area disposed at the substrate and configured to have an emission area and a non-emission area, a planarization layer disposed at the substrate, and a light emitting device layer disposed at the pixel area above the planarization layer, the light emitting device layer may include a first electrode disposed at the emission area of the planarization layer, a self-light emitting portion configured to surround the first electrode, a second electrode at the self-light emitting portion, and a non-conductive metal oxide layer disposed between an end of the first electrode and the second electrode.

According to the embodiments of the present disclosure, the non-conductive metal oxide layer may contact the first electrode through the self-light emitting portion from the second electrode.

According to the embodiments of the present disclosure, the light emitting device layer may include a groove portion disposed at the non-emission area, and the non-conductive metal oxide layer may be disposed between the second electrode and an end of the first electrode overlapped with the groove portion.

The light emitting display apparatus according to an embodiment of the present disclosure may be applied to various applications. For example, the light emitting display apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic book, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, TVs, wall paper display apparatuses, signage apparatuses, game machines, notebook computers, monitors, cameras, camcorders, home appliances, etc.

It will be apparent to those skilled in the art that various modifications and variations can be made in the light emitting display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A light emitting display apparatus, comprising:
a substrate;
a pixel area disposed at the substrate and configured to have an emission area and a non-emission area;
a planarization layer disposed at the substrate, the planarization having a groove; and
a light emitting device layer disposed at the emission area and the non-emission area at the planarization layer,
wherein the light emitting device layer includes a barrier layer disposed at the boundary area between the emission area and the non-emission area,
wherein the light emitting device layer includes:
a first electrode;
a self-light emitting portion at the first electrode; and
a second electrode at the self-light emitting portion,
wherein the barrier layer is disposed between the first electrode and the second electrode, and
wherein the self-light emitting portion includes a first portion disposed at a remaining portion of the planarization layer except the groove and a second portion disposed in the groove, and
the barrier layer is disposed between the first portion and the second portion.

2. The light emitting display apparatus according to claim 1,
wherein the light emitting device layer includes a groove portion disposed in the non-emission area,
wherein the barrier layer is disposed at the periphery of one end of the first electrode adjacent to the groove portion.

3. The light emitting display apparatus according to claim 1, wherein the barrier layer is formed of a non-conductive metal oxide based on the second electrode, or is configured to disconnect the self-light emitting portion at the boundary area between the emission area and the non-emission area.

4. The light emitting display apparatus according to claim 1, further comprising a groove concavely provided from the planarization layer of the non-emission area,
wherein the first electrode is disposed at the remaining portions of the planarization layer except the groove, and
the self-light emitting portion is disposed at the first electrode and the groove.

5. The light emitting display apparatus according to claim 4, wherein the barrier layer is disposed between the second electrode and an end of the first electrode adjacent to the groove.

6. The light emitting display apparatus according to claim 4,
wherein the groove includes an upper area having an incline which is inclined from the upper surface of the planarization layer,
wherein the incline has a tangential inclination of 75° or more with respect to the upper surface of the planarization layer.

7. The light emitting display apparatus according to claim 4,
wherein the groove includes an incline which is inclined from the upper surface of the planarization layer,
wherein the incline has a maximum tangential inclination within an area of a first distance and a first depth from the end of the first electrode.

8. The light emitting display apparatus according to claim 7,
wherein the first distance is 0.5 micrometer or less, and the first depth is 0.8 micrometer or less.

9. The light emitting display apparatus according to claim 4,
wherein the groove is disposed in the non-emission area between the emission areas of adjacent pixel areas along a first direction, and
the barrier layer is disposed at the periphery of each of one end and the other end of the first electrode adjacent to the groove.

10. The light emitting display apparatus according to claim 4, further comprising a driving thin film transistor disposed in a circuit area of the pixel area,
wherein the planarization layer is disposed above the driving thin film transistor, and
the first electrode includes an extending portion coupled to the driving thin film transistor via an electrode contact hole provided at the planarization layer.

11. The light emitting display apparatus according to claim 10, further comprising at least one or more of a bank layer disposed above the electrode contact hole and a wavelength conversion layer overlapped with the emission area.

12. The light emitting display apparatus according to claim 10,
wherein the groove is disposed to surround the remaining portions of the first electrode except the extending portion of the first electrode, and
the barrier layer is disposed to surround the remaining portions of the first electrode except the extending portion of the first electrode.

13. The light emitting display apparatus according to claim 1, further comprising a light extraction pattern disposed at the planarization layer of the emission area,
wherein the light extraction pattern includes:
a plurality of concave portions; and
a protruding portion between the plurality of concave portions.

14. The light emitting display apparatus according to claim 13, wherein the concave portions are arranged along the first direction while being parallel with each other, arranged in a zigzag shape along a second direction perpendicular to the first direction, or arranged in a honeycomb structure.

15. The light emitting display apparatus according to claim 13, wherein the barrier layer is formed of a non-conductive metal oxide, or is configured to disconnect the self-light emitting portion at the boundary area between the emission area and the non-emission area.

16. The light emitting display apparatus according to claim 13, further comprising a groove concavely provided from the planarization layer of the non-emission area, wherein the first electrode is disposed at the remaining portions of the planarization layer except the groove, and the self-light emitting portion is disposed above the first electrode and the groove.

17. The light emitting display apparatus according to claim 16, wherein the barrier layer is disposed at the periphery of the shortest distance between the first electrode and the second electrode adjacent to the groove.

18. The light emitting display apparatus according to claim 1, wherein the self-light emitting portion have a smallest thickness at an end of the first electrode E1.

19. A light emitting display apparatus, comprising:

a substrate;

a pixel area disposed at the substrate and configured to have an emission area and a non-emission area;

a planarization layer disposed at the substrate, the planarization layer having a groove; and a light emitting device layer disposed at the pixel area at the planarization layer, wherein the light emitting device layer includes:

a first electrode;

a self-light emitting portion at the first electrode; and a second electrode at the self-light emitting portion, wherein a barrier layer is disposed at the periphery of the shortest distance between the first electrode and the second electrode, wherein the barrier layer is disposed between the first electrode and the second electrode, and wherein the self-light emitting portion includes a first portion disposed at a remaining portion of the planarization layer except the groove and a second portion disposed in the groove, and wherein the barrier layer is disposed between the first portion and the second portion.

20. The light emitting display apparatus according to claim 19, wherein the light emitting device layer includes a groove portion disposed in the non-emission area, wherein the barrier layer is disposed at the periphery of the shortest distance between the first electrode and the second electrode overlapped with the groove portion.

* * * * *